United States Patent
Lin et al.

(10) Patent No.: US 11,502,188 B2
(45) Date of Patent: Nov. 15, 2022

(54) APPARATUS AND METHOD FOR BOOSTING SIGNAL IN MAGNETOELECTRIC SPIN ORBIT LOGIC

(71) Applicant: Intel Corporation, Santa Clara, CA (US)

(72) Inventors: Chia-Ching Lin, Portland, OR (US); Sasikanth Manipatruni, Portland, OR (US); Dmitri Nikonov, Beaverton, OR (US); Ian A. Young, Portland, OR (US); Benjamin Buford, Hillsboro, OR (US); Tanay Gosavi, Hillsboro, OR (US); Kaan Oguz, Portland, OR (US); John J. Plombon, Portland, OR (US)

(73) Assignee: Intel Corporation, Santa Clara, CA (US)

(*) Notice: Subject to any disclaimer, the term of this patent is extended or adjusted under 35 U.S.C. 154(b) by 712 days.

(21) Appl. No.: 16/009,110

(22) Filed: Jun. 14, 2018

(65) Prior Publication Data

US 2019/0386662 A1    Dec. 19, 2019

(51) Int. Cl.
*H01L 29/66* (2006.01)
*H03K 19/18* (2006.01)
(Continued)

(52) U.S. Cl.
CPC ... *H01L 29/66984* (2013.01); *H01F 10/3213* (2013.01); *H01F 41/302* (2013.01);
(Continued)

(58) Field of Classification Search
CPC ..... H01L 27/22; H01L 27/222; H01L 27/228; H01L 29/66984; H01L 43/02; H01L 43/10; Y10S 977/933; H03K 19/18
See application file for complete search history.

(56) References Cited

U.S. PATENT DOCUMENTS

| | | |
|---|---|---|
| 6,057,049 A | 5/2000 | Fuke et al. |
| 6,965,138 B2 | 11/2005 | Nakajima et al. |

(Continued)

FOREIGN PATENT DOCUMENTS

| | | |
|---|---|---|
| CN | 105161613 | 12/2015 |
| WO | 2016105436 | 6/2016 |

(Continued)

OTHER PUBLICATIONS

Liu, Luqiao, et al., "Spin Hall effect tunneling spectroscopy", Nature Physics, vol. 10, Aug. 2014, 6 pgs.

(Continued)

*Primary Examiner* — Tucker J Wright
(74) *Attorney, Agent, or Firm* — Essential Patents Group, LLP

(57) ABSTRACT

An apparatus is provided to improve spin injection efficiency from a magnet to a spin orbit coupling material. The apparatus comprises: a first magnet; a second magnet adjacent to the first magnet; a first structure comprising a tunneling barrier; a third magnet adjacent to the first structure; a stack of layers, a portion of which is adjacent to the third magnet, wherein the stack of layers comprises spin-orbit material; and a second structure comprising magnetoelectric material, wherein the second structure is adjacent to the first magnet.

20 Claims, 12 Drawing Sheets

(51) Int. Cl.
  *H01L 43/06* (2006.01)
  *H01F 10/32* (2006.01)
  *H01F 41/30* (2006.01)
  *H03K 19/0944* (2006.01)
  *H01L 27/02* (2006.01)
  *B82Y 25/00* (2011.01)

(52) U.S. Cl.
  CPC .......... *H01L 27/0222* (2013.01); *H01L 43/06* (2013.01); *H03K 19/0944* (2013.01); *H03K 19/18* (2013.01); *B82Y 25/00* (2013.01)

(56) References Cited

U.S. PATENT DOCUMENTS

| | | | |
|---|---|---|---|
| 7,098,495 | B2 | 8/2006 | Sun et al. |
| 7,259,607 | B2 | 8/2007 | Sommer |
| 7,538,402 | B2 | 5/2009 | Fukumoto |
| 8,018,011 | B2 | 9/2011 | Ranjan et al. |
| 8,159,870 | B2 | 4/2012 | Xia |
| 8,169,821 | B1 | 5/2012 | Ranjan et al. |
| 8,476,722 | B2 | 7/2013 | Lee |
| 9,251,883 | B2 | 2/2016 | Wu et al. |
| 10,276,784 | B1 | 4/2019 | Yu et al. |
| 10,283,701 | B1 | 5/2019 | Ikhtiar et al. |
| 10,340,445 | B2 | 7/2019 | Oguz et al. |
| 10,453,510 | B2 | 10/2019 | Park et al. |
| 10,522,740 | B2 | 12/2019 | Chuang et al. |
| 10,749,104 | B2 * | 8/2020 | Liu .................. H01L 43/02 |
| 10,916,284 | B2 | 2/2021 | Le et al. |
| 2004/0125673 | A1 | 7/2004 | Daughton et al. |
| 2004/0150017 | A1 | 8/2004 | Tsang |
| 2004/0211963 | A1 | 10/2004 | Garni et al. |
| 2005/0152075 | A1 | 7/2005 | Miyazawa et al. |
| 2005/0174836 | A1 | 8/2005 | Sharma et al. |
| 2005/0247964 | A1 | 11/2005 | Pietambaram et al. |
| 2007/0063237 | A1 | 3/2007 | Huai et al. |
| 2007/0183187 | A1 | 8/2007 | Guo |
| 2008/0273375 | A1 | 11/2008 | Dahmani et al. |
| 2009/0166773 | A1 | 7/2009 | Ohno et al. |
| 2010/0090300 | A1 | 4/2010 | Xi et al. |
| 2012/0126905 | A1 | 5/2012 | Zhang et al. |
| 2012/0163070 | A1 | 6/2012 | Nagase et al. |
| 2013/0001506 | A1 | 1/2013 | Sato et al. |
| 2013/0001652 | A1 | 1/2013 | Yoshikawa et al. |
| 2013/0099780 | A1 | 4/2013 | Ma et al. |
| 2013/0141966 | A1 | 6/2013 | Ohno et al. |
| 2013/0299929 | A1 | 11/2013 | Watanabe et al. |
| 2013/0336045 | A1 | 12/2013 | Kuo et al. |
| 2014/0021426 | A1 | 1/2014 | Lee et al. |
| 2014/0056060 | A1 | 2/2014 | Khvalkovskiy et al. |
| 2014/0084398 | A1 | 3/2014 | Oguz et al. |
| 2014/0084938 | A1 | 3/2014 | Lai et al. |
| 2014/0145792 | A1 | 5/2014 | Wang et al. |
| 2014/0169088 | A1 | 6/2014 | Buhrman et al. |
| 2014/0175582 | A1 | 6/2014 | Apalkov et al. |
| 2014/0254256 | A1 | 9/2014 | Choi |
| 2014/0269035 | A1 | 9/2014 | Manipatruni et al. |
| 2014/0306302 | A1 | 10/2014 | Guenole et al. |
| 2015/0008547 | A1 | 1/2015 | Pi et al. |
| 2015/0035095 | A1 | 2/2015 | Kim et al. |
| 2015/0041934 | A1 | 2/2015 | Khvalkovskiy et al. |
| 2015/0061020 | A1 | 3/2015 | Yokoyama et al. |
| 2015/0076633 | A1 | 3/2015 | Siddik et al. |
| 2015/0171316 | A1 | 6/2015 | Park et al. |
| 2016/0043301 | A1 | 2/2016 | Butler et al. |
| 2016/0079518 | A1 | 3/2016 | Pi et al. |
| 2016/0155932 | A1 | 6/2016 | Chen et al. |
| 2016/0163965 | A1 | 6/2016 | Han et al. |
| 2016/0225423 | A1 | 8/2016 | Naik et al. |
| 2016/0300612 | A1 | 10/2016 | Manipatruni et al. |
| 2016/0380188 | A1 | 12/2016 | Hu |
| 2017/0069827 | A1 | 3/2017 | Lee et al. |
| 2017/0092848 | A1 | 3/2017 | Jang et al. |
| 2017/0098760 | A1 | 4/2017 | Lin et al. |
| 2017/0148978 | A1 | 5/2017 | Apalkov et al. |
| 2017/0178705 | A1 | 6/2017 | Buhrman et al. |
| 2017/0243917 | A1 | 8/2017 | Manipatruni et al. |
| 2018/0061887 | A1 | 3/2018 | Braganca |
| 2018/0066375 | A1 | 3/2018 | Morgan et al. |
| 2018/0076384 | A1 | 3/2018 | Gan et al. |
| 2018/0083067 | A1 | 3/2018 | Kim et al. |
| 2018/0114898 | A1 | 4/2018 | Lee |
| 2018/0123027 | A1 | 5/2018 | Yamane et al. |
| 2018/0123028 | A1 | 5/2018 | Shiokawa et al. |
| 2018/0129043 | A1 | 5/2018 | Kim et al. |
| 2018/0130943 | A1 | 5/2018 | Naik et al. |
| 2018/0158588 | A1 | 6/2018 | Manipatruni et al. |
| 2018/0175286 | A1 | 6/2018 | Sato et al. |
| 2018/0219152 | A1 | 8/2018 | Apalkov et al. |
| 2018/0233187 | A1 | 8/2018 | Lim et al. |
| 2018/0240896 | A1 | 8/2018 | Nikonov et al. |
| 2018/0240970 | A1 | 8/2018 | Oguz et al. |
| 2018/0248113 | A1 | 8/2018 | Pinarbasi et al. |
| 2018/0248114 | A1 | 8/2018 | Oguz et al. |
| 2018/0248115 | A1 | 8/2018 | Oguz et al. |
| 2018/0287052 | A1 | 10/2018 | Wang et al. |
| 2018/0374526 | A1 | 12/2018 | Lee et al. |
| 2019/0006414 | A1 | 1/2019 | Huai et al. |
| 2019/0043548 | A1 | 2/2019 | Park et al. |
| 2019/0057731 | A1 | 2/2019 | Lua et al. |
| 2019/0079701 | A1 | 3/2019 | Rakshit et al. |
| 2019/0081234 | A1 | 3/2019 | Naik et al. |
| 2019/0165253 | A1 | 5/2019 | Sun et al. |
| 2019/0244651 | A1 | 8/2019 | Shiokawa et al. |
| 2019/0252601 | A1 | 8/2019 | Chatterjee et al. |
| 2019/0272863 | A1 | 9/2019 | Jung et al. |
| 2019/0287589 | A1 | 9/2019 | Buyandalai et al. |
| 2019/0287597 | A1 | 9/2019 | Koui et al. |
| 2019/0304524 | A1 | 10/2019 | Oguz et al. |
| 2019/0304525 | A1 | 10/2019 | Manipatruni et al. |
| 2019/0304653 | A1 | 10/2019 | Oguz et al. |
| 2019/0305212 | A1 | 10/2019 | Gosavi et al. |
| 2019/0305216 | A1 | 10/2019 | Gosavi et al. |
| 2019/0305217 | A1 | 10/2019 | Xue et al. |
| 2019/0325931 | A1 | 10/2019 | Victora et al. |
| 2019/0326353 | A1 | 10/2019 | O'Brien et al. |
| 2019/0385655 | A1 | 12/2019 | Lin et al. |
| 2019/0386120 | A1 | 12/2019 | Lin et al. |
| 2019/0386205 | A1 | 12/2019 | Gosavi et al. |
| 2019/0386208 | A1 | 12/2019 | Lin et al. |
| 2019/0386209 | A1 | 12/2019 | Smith et al. |
| 2019/0386662 | A1 | 12/2019 | Lin et al. |
| 2020/0006424 | A1 | 1/2020 | Sato et al. |
| 2020/0006628 | A1 | 1/2020 | O'Brien et al. |
| 2020/0035282 | A1 | 1/2020 | Lee et al. |
| 2020/0083286 | A1 | 3/2020 | Manipatruni et al. |
| 2020/0083427 | A1 | 3/2020 | Manipatruni et al. |
| 2020/0098410 | A1 | 3/2020 | Gosavi et al. |
| 2020/0105998 | A1 | 4/2020 | Smith et al. |
| 2020/0161535 | A1 | 5/2020 | Lin et al. |
| 2020/0227104 | A1 | 7/2020 | Rahman et al. |
| 2020/0273864 | A1 | 8/2020 | Manipatruni et al. |
| 2020/0273866 | A1 | 8/2020 | Manipatruni et al. |
| 2020/0273867 | A1 | 8/2020 | Manipatruni et al. |
| 2020/0303343 | A1 | 9/2020 | Manipatruni et al. |
| 2020/0303344 | A1 | 9/2020 | Manipatruni et al. |
| 2020/0312907 | A1 | 10/2020 | Ouellette et al. |
| 2020/0313084 | A1 | 10/2020 | Ouellette et al. |
| 2020/0321344 | A1 | 10/2020 | Ramamoorthy et al. |
| 2020/0321472 | A1 | 10/2020 | Ramamoorthy et al. |
| 2020/0321473 | A1 | 10/2020 | Ramamoorthy et al. |
| 2020/0321474 | A1 | 10/2020 | Ramamoorthy et al. |
| 2020/0402560 | A1 | 12/2020 | Thirumala et al. |
| 2021/0012940 | A1 | 1/2021 | Salahuddin et al. |
| 2021/0202507 | A1 | 7/2021 | Thareja et al. |
| 2021/0202510 | A1 | 7/2021 | Thareja et al. |
| 2021/0202689 | A1 | 7/2021 | Thareja et al. |
| 2021/0202690 | A1 | 7/2021 | Thareja et al. |
| 2021/0203324 | A1 | 7/2021 | Manipatruni et al. |
| 2021/0203325 | A1 | 7/2021 | Manipatruni et al. |
| 2021/0203326 | A1 | 7/2021 | Manipatruni et al. |

(56) References Cited

U.S. PATENT DOCUMENTS

| | | | |
|---|---|---|---|
| 2021/0226636 | A1 | 7/2021 | Manipatruni et al. |
| 2021/0303981 | A1 | 9/2021 | Sasaki et al. |

FOREIGN PATENT DOCUMENTS

| | | |
|---|---|---|
| WO | 2016209272 | 12/2016 |
| WO | 2017044095 | 3/2017 |
| WO | 2017052606 | 3/2017 |
| WO | 2017105396 | 6/2017 |
| WO | 2017135767 | 8/2017 |
| WO | 2019005146 | 1/2019 |
| WO | 2019066820 | 4/2019 |

OTHER PUBLICATIONS

Liu, Luqiao, et al., "Spin-polarized tunneling study of spin-momentum locking in topological insulators", Physical Review B 91, 235437, 2015, 10 pgs.

Manipatruni, et al., "Spin-Orbit Logic with Magnetoelectric Switching: A Multi Generation Scalable Charge Mediated Nonvolatile Spintronic Logic", (Submitted on Dec. 17, 2015 (v1), last revised Mar. 5, 2017 (this version, v2)) arXiv:1512.05428, 60 pages.

Cubukcu, Murat, et al., "Spin-orbit torque magnetization switching of a three-terminal perpendicular magnetic tunnel junction", Applied Physics Letters 104, 2014, 5 pgs.

Fecioru-Morariu, M., et al., "Effects of Cu Dilution in IrMn on the Exchange Bias of CoFe/IrMn Bilayers", Physical Review Letters, vol. 9 9, No. 9, Aug. 1, 2007 (Aug. 1, 2007), XP055614810, US. ISSN: 0031-9007, DOI: 10.1103/PhysRevLett.99.097206.

Han, G., et al., "Control of Offset Field and Pinning Stability in Perpendicular Magnetic Tunneling Junctions with Synthetic Antiferromagnetic Coupling Multilayer", Journal of Applied Physics, American Institute of Physics, US. vol. 117, No. 17, May 7, 2015 (May 7, 2015), XP012195354, ISSN: 0021-8979, DOI: 10.1063/1.4913942.

Keller, J., et al., "Domain STTE Model for Exchange Bias II. Experiment", Physical Review, B. Condensed Matter, American Institute of Physics. New York, US, vol. 66, No. 1, Jul. 1, 2002 (Jul. 1, 2002), pp. 14431-01, XP001125751, ISSN: 0163-1829, DOI: 10.1103/PHYSREVB.66.014431.

Kiyohara, et al., "Giant Anomalous Hall Effect in the Chiral Antiferromagnet Mn3Ge", arXiv, Jul. 2, 2016, pp. 1-10, XP002793937, DOI: 10.1103/PhysRevApplied.5.064009. Retrieved from the Internet: URL:https://arxiv.org/pdf/1511.04619.pdf.

Lau, et al., "Spin-orbit torques and spin hall magnetoresistance in antiferromagnetic hexagonal [epsilon] Mn3Ga/CoFeb bilayers", 2017 IEEE International Magnetics Conference (Intermag), IEEE, 24, Apr. 2017, p. 1, XP033141017, DOI: 10.1109/INTMAG.2017.8007779.

Lim , et al., "Study on Exchange-Biased Perpendicular Magnetic Tunnel Junction Based on Pd/Co Multilayers", IEEE Transactions on Magnetics, vol. 4 5, No. 6, Jun. 1, 2009 pp. 2407-2409, XP011258109, IEEE Service Center, New York, NY US ISSN: 0018-9464, DOI: 10.1109/TMAG.2009.2018590.

Misra, A., "Control of exchange bias by diluting the antiferromagnetic layer", Journal of Applied Physics, American Institute of Physics, US, vol. 93, No. 10, May 15, 2003 (May 15, 2003), pp. 6593-6595, XP012057898, ISSN: 0021-8979, DOI: 10.1063/1.1543880.

Niida, et al., "Crystal distortion and weak ferromagnetism of Mn3+[delta] Ga 1-x Ge x alloys", Journal of Applied Physics, vol. 73, No. 10, May 15, 1993 pp. 5692-5694, XP055616327.

Wang, M., et al., "Tunnel Junction with Perpendicular Magnetic Anisotropy: Status and Challenges", MICROMACHINES, vol. 6, No. 8, Aug. 10, 2015 (Aug. 10, 2015), pp. 1023-1045, XP055614473, CH, ISSN: 2072-666X, DOI: 10.3390/mi6081023.

Zelezny, J., et al., "Spin transport and spin torque in antiferromagnetic devices" , Nature Physics, Nature Publishing Group, London, GB, vol. 14, No. 3, Mar. 2, 2018 (Mar. 2, 2018), pp. 220-228, XP036660204, ISSN: 1745-2473, DOI: 10.1038/S41567-018-0062-7.

Zhang, et al., "Spin Hall effect emerging from a chiral magnetic lattice without spin-orbit coupling", ARXIV, Apr. 12, 2017, pp. 1-13, XP081145399, ARXIV USA, p. 2, p. 9, line 3-line 14.

\* cited by examiner

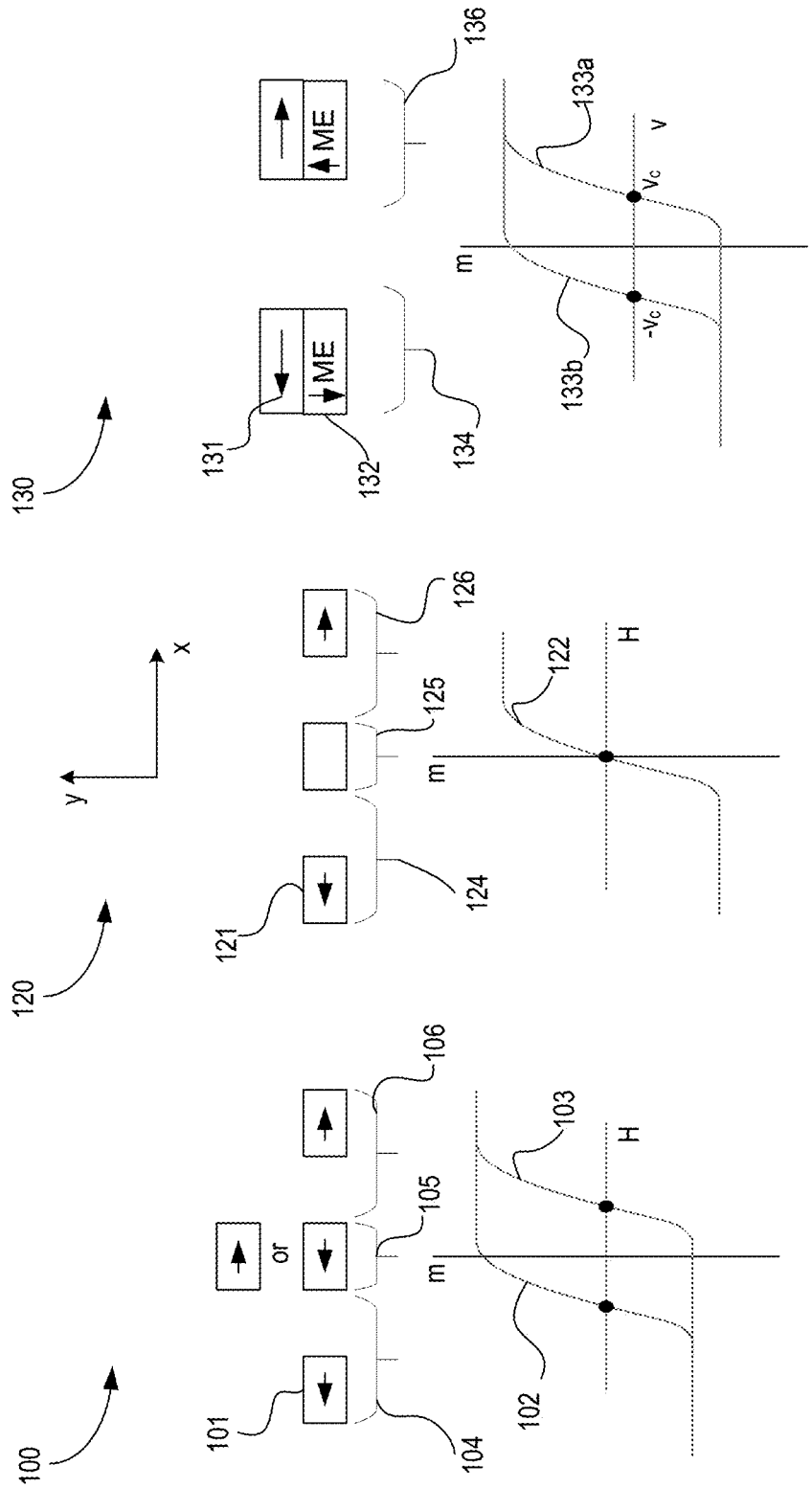

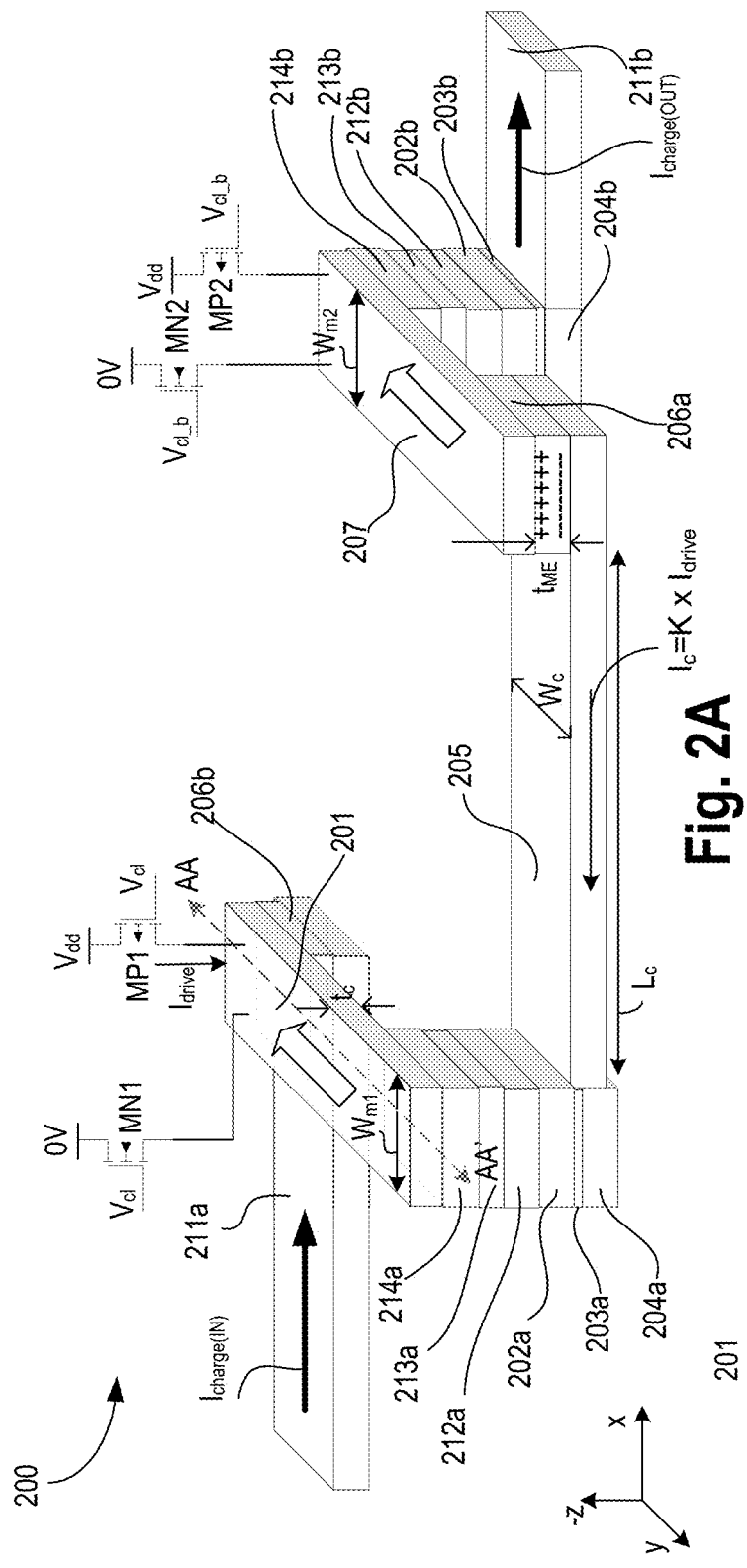
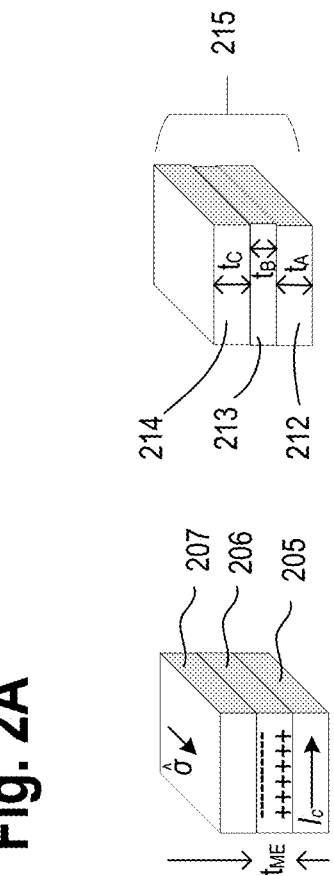
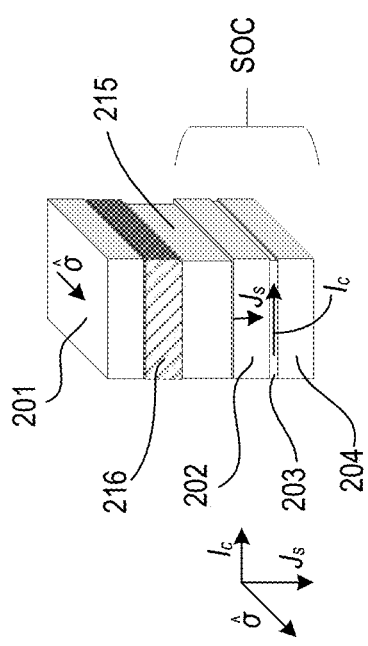
Fig. 2A
Fig. 2B
Fig. 2C
Fig. 2D

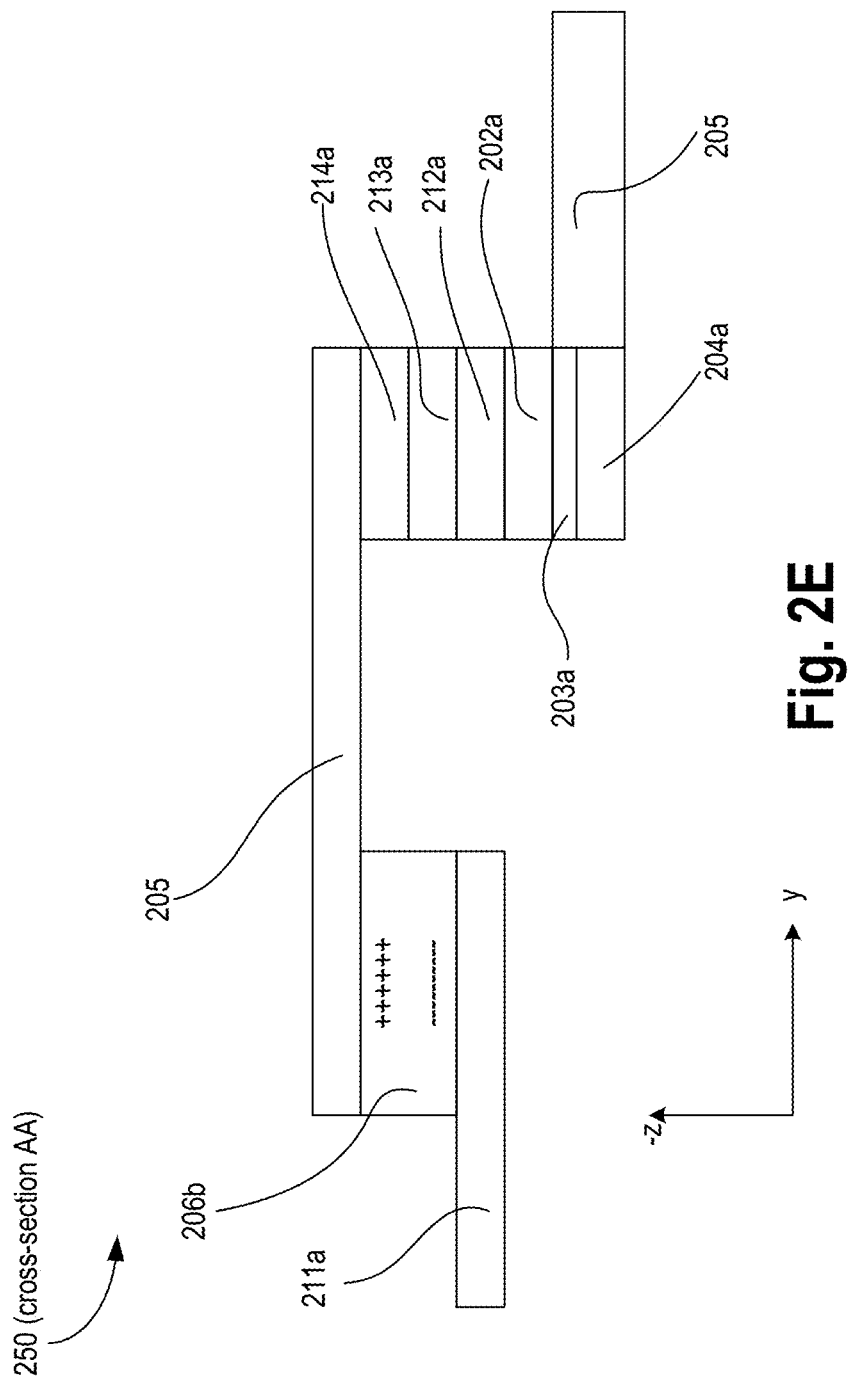

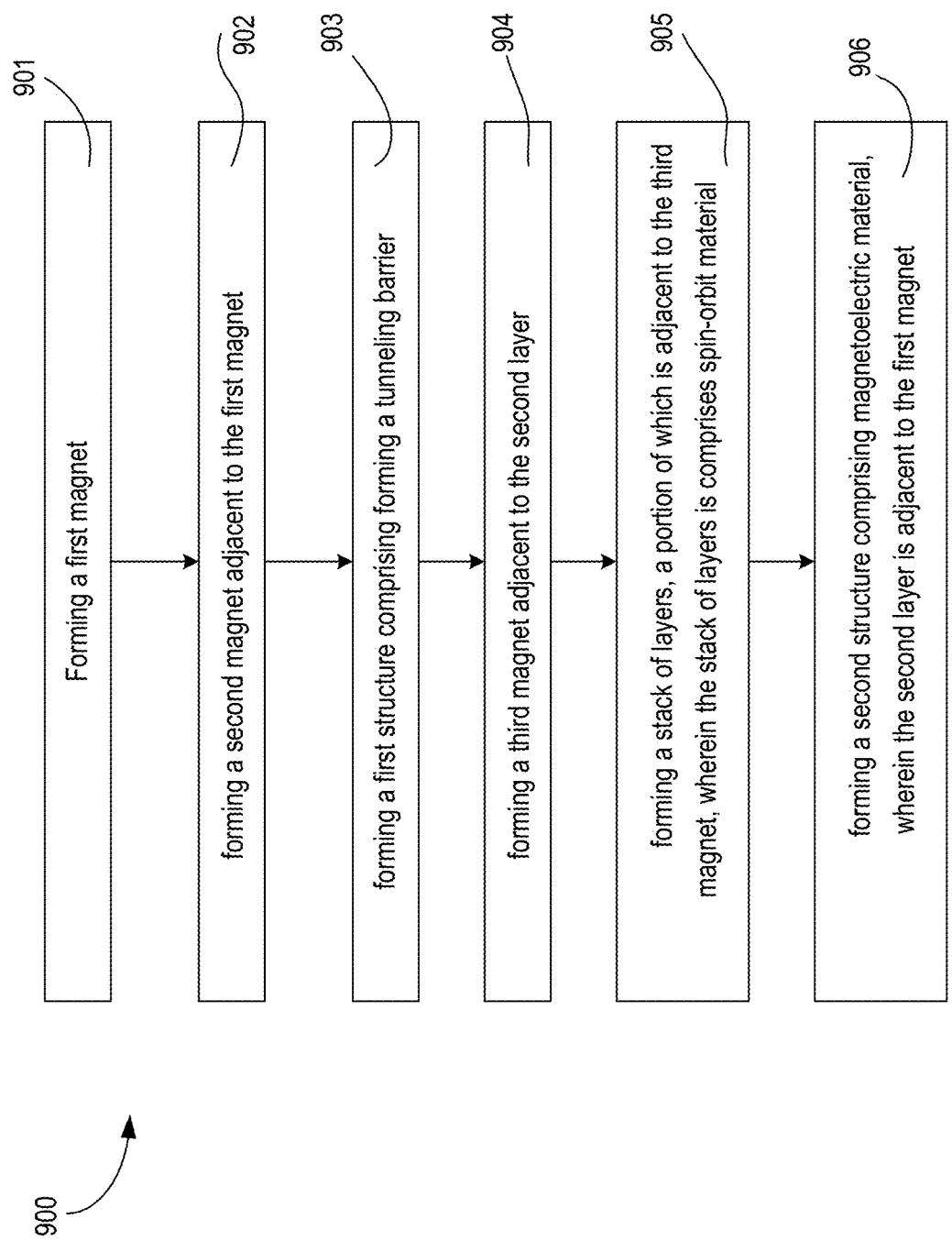

APPARATUS AND METHOD FOR BOOSTING SIGNAL IN MAGNETOELECTRIC SPIN ORBIT LOGIC

BACKGROUND

Spintronics is the study of intrinsic spin of the electron and its associated magnetic moment in solid-state devices. Spintronic logic are integrated circuit devices that use a physical variable of magnetization or spin as a computation variable. Such variables can be non-volatile (e.g., preserving a computation state when the power to an integrated circuit is switched off). Non-volatile logic can improve the power and computational efficiency by allowing architects to put a processor to un-powered sleep states more often and therefore reduce energy consumption. Existing spintronic logic generally suffer from high energy and relatively long switching times.

For example, large write current (e.g., greater than 100 µA/bit) and voltage (e.g., greater than 0.7 V) are needed to switch a magnet (i.e., to write data to the magnet) in Magnetic Tunnel Junctions (MTJs). Existing Magnetic Random Access Memory (MRAM) based on MTJs also suffer from high write error rates (WERs) or low speed switching. For example, to achieve lower WERs, switching time is slowed down which degrades the performance of the MRAM. MTJ based MRAMs also suffer from reliability issues due to tunneling current in the spin filtering tunneling dielectric of the MTJs e.g., magnesium oxide (MgO).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A illustrates a magnetization response to applied magnetic field for a ferromagnet.

FIG. 1B illustrates a magnetization response to applied magnetic field for a paramagnet.

FIG. 1C illustrates magnetization response to applied voltage field for a paramagnet connected to a magnetoelectric layer.

FIG. 2A illustrates a magnetoelectric spin orbit (MESO) logic with symmetric tunneling barrier or spin filter, according to some embodiments of the disclosure.

FIG. 2B illustrates a spin orbit material stack at the input of an interconnect, according to some embodiments of the disclosure.

FIG. 2C illustrates a magnetoelectric material stack at the output of an interconnect, according to some embodiments of the disclosure.

FIG. 2D illustrates a symmetric tunneling barrier or spin filter stack, according to some embodiments of the disclosure.

FIG. 2E illustrates a cross-section of an input portion of the MESO logic of FIG. 2A, in accordance with some embodiments.

FIG. 9 illustrates a flowchart of a method for forming a MESO logic with symmetric tunneling barrier or spin filter, according to some embodiments of the disclosure.

DETAILED DESCRIPTION

Figure 3:
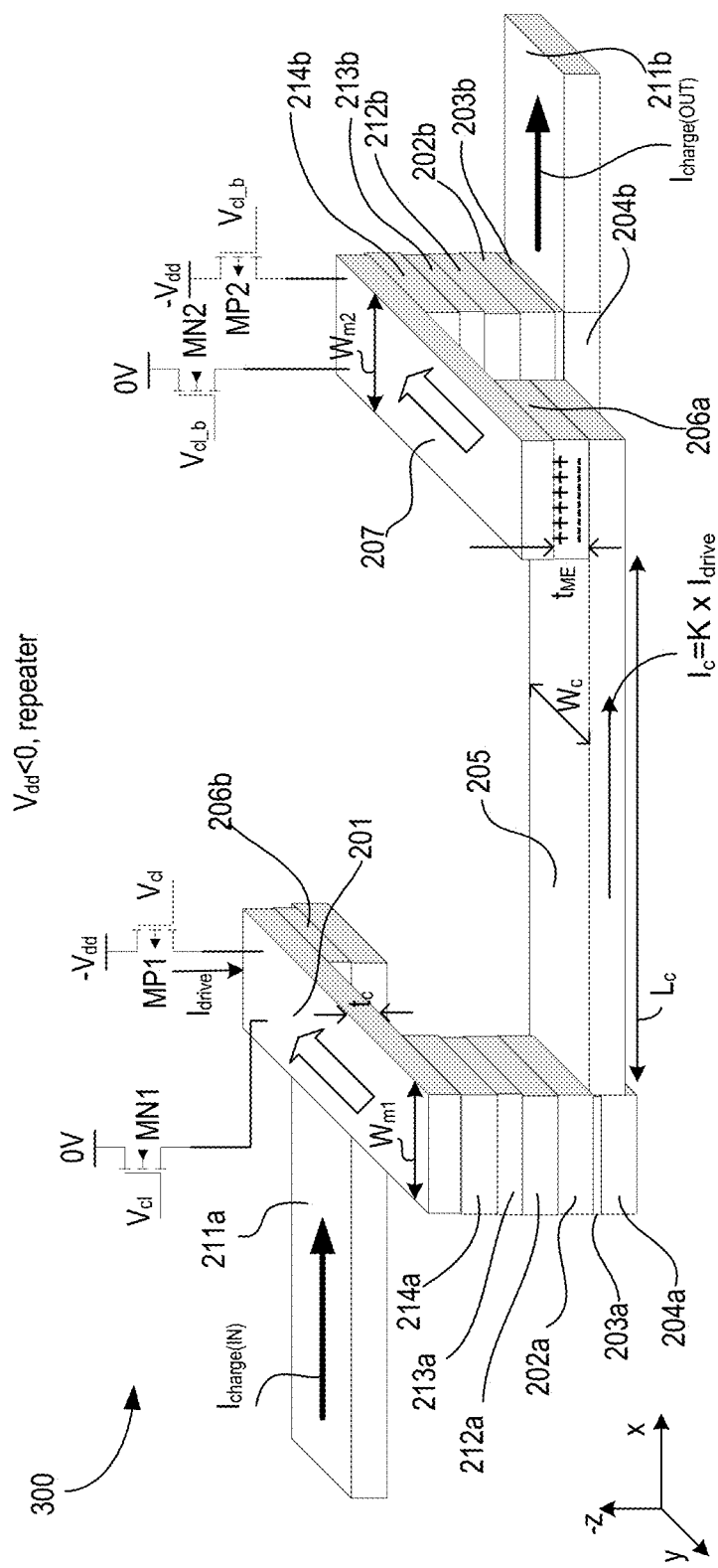
FIG. 3 illustrates a MESO logic operable as a repeater, according to some embodiments.

Spin polarized current is generally conducted between nanomagnets to switch magnetization by spin torque effect. In this and multiple other spintronic devices, the signal is sent from one node to the other as a spin quantity (e.g., spin polarized current, a domain wall, or a spin wave). These signals are slow (e.g., 1000 m/s) and exponentially attenuate over the length of the interconnect (e.g., 1 µm). Various embodiments describe a logic device in which the signal is sent over an electrical interconnect. The charge current does not attenuate and the communication is much faster (e.g., limited by the RC delay of the interconnect). Generally, current induced injection of spin current from a magnet is used as the charge-to-spin conversion, and spin torque is used to switch magnetization in the output magnet. In such a case, the effect of magnetoresistance detected by a sense amplifier is used as the spin-to-charge conversion. Due to much more efficient conversion mechanisms, the switching time of the logic device of various embodiments is faster than general spin logic devices (e.g., 100 ps vs. 1 ns). The switching energy of the logic device of various embodiments is also lower than general spin logic devices (e.g., 10 aJ vs. 100 fJ).

Various embodiments use magnetoelectric (ME) effect to improve logic efficiency. ME effect has the ability to manipulate the magnetization (and the associated spin of electrons in the material) by an applied electric field. Since an estimated energy dissipation per unit area per magnet switching event through the ME effect is an order of magnitude smaller than with spin-transfer torque (STT) effect, ME materials have the capability for next-generation memory and logic applications.

Various embodiments describe a Magnetoelectric Spin Orbit Logic (MESO) which is a combination of various physical phenomena for spin-to-charge and charge-to-spin conversion. In some embodiments, spin-to-charge conversion is achieved via a layer with spin-orbit (SO) coupling, such as the inverse Rashba-Edelstein effect or inverse spin Hall effect, wherein a spin current injected from an input magnet produces a charge current. The sign of the charge current is determined by the direction of the injected spin and thus of magnetization. In some embodiments, charge-to-spin conversion is achieved via a magnetoelectric effect in which the charge current produces a voltage on a capacitor, comprising a layer with magnetoelectric effect, leading to switching magnetization of an output magnet. In some embodiments, magnetic response of the magnet is according to an applied exchange bias from the magnetoelectric effect.

For high efficient and low power logic computation in MESO logic, a high spin orbit output signal is used to drive the next ME input. Currently, materials with high spin-orbital coupling (SOC) effect, such as topological insulator (TI) and material with high Rashba-Edelstein Effect (REE), are used in a spin orbit module of the MESO logic. During magnetization-to-charge conversion, most spins dissipate at the interface of the spin orbit module and the magnet due to scattering, conductance mismatch, and lattice mismatch, which dramatically lower the SO output signal.

Inserting a tunneling barrier between a magnet and an SOC material, without more, merely adjusts Fermi level between the two layers but may not improve spin injection efficiency and boost output signal at all. In some embodiments, a symmetric tunneling barrier or a spin-filter stack is inserted between a spin-orbital coupling (SOC) material and magnet (e.g., a ferromagnet).

Here, the term "symmetric tunneling barrier" generally refers to a crystal structure of magnet and tunneling barrier being the same.

Here, the term "spinel type tunneling barrier" generally refers to the magnet and tunneling barrier being both "spinel" type of materials. In some embodiments, when the magnet and the tunneling barrier are not the same lattice structure or the same "spinel" type, a very thin buffer layer(s) can be inserted to match the lattice structure or become "spinel" type.

There are many technical effects of various embodiments. For example, high speed operation of the logic (e.g., 100 picoseconds (ps)) is achieved via the use of magnetoelectric switching operating on nanomagnets. In some examples, switching energy is reduced (e.g., 1-10 attojoules (aJ)) because the current needs to be "on" for a shorter time (e.g., approximately 3 ps) in order to charge the capacitor. In some examples, in contrast to the spin current, here charge current does not attenuate when it flows through an interconnect. The spin injection efficiency from magnet to the SOC material in the SO module can be improved from 10% to approximately 20% (without tunneling barrier or wrong tunneling barrier) to 70% to approximately 90% (with symmetric tunneling barrier or spin-filter stack). In some embodiments, the SO output signal boosts at least 400% in the MESO device. Boosting SO output signal indicates that the supply voltage in MESO device can be lowered, which can further lower the power consumption in the MESO logic. Other technical effects will be evident from various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque, etc.).

Here, perpendicularly magnetized magnet (or perpendicular magnet, or magnet with perpendicular magnetic anisotropy (PMA)) refers to a magnet having a magnetization which is substantially perpendicular to a plane of the magnet or a device. For example, a magnet with a magnetization which is in a z-direction in a range of 90 (or 270) degrees+/−20 degrees relative to an x-y plane of a device.

Here, an in-plane magnet refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z-direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back." "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

For the purposes of present disclosure, the terms "spin" and "magnetic moment" are used equivalently. More rigorously, the direction of the spin is opposite to that of the magnetic moment, and the charge of the particle is negative (such as in the case of electron).

It is pointed out that those elements of the figures having the same reference numbers (or names) as the elements of any other figure can operate or function in any manner similar to that described but are not limited to such.

FIG. 1A illustrates a magnetization hysteresis plot 100 for ferromagnet (FM) 101. The plot shows magnetization response to an applied magnetic field for ferromagnet 101. The x-axis of plot 100 is magnetic field 'H' while the y-axis is magnetization 'm'. For FM 101, the relationship between 'H' and 'm' is not linear and results in a hysteresis loop as shown by curves 102 and 103. The maximum and minimum magnetic field regions of the hysteresis loop correspond to saturated magnetization configurations 104 and 106, respectively. In saturated magnetization configurations 104 and 106, FM 101 has stable magnetization. In the zero magnetic field region 105 of the hysteresis loop, FM 101 does not have a definite value of magnetization, but rather depends on the history of applied magnetic fields. For example, the magnetization of FM 101 in configuration 106 can be either in the +x direction or the −x direction for an in-plane FM. As such, changing or switching the state of FM 101 from one magnetization direction (e.g., configuration 104) to another magnetization direction (e.g., configuration 106) is time consuming resulting in slower nanomagnets response time. It is associated with the intrinsic energy of switching proportional to the area in the graph contained between curves 102 and 103.

In some embodiments, FM 101 is formed of CFGG (i.e., Cobalt (Co), Iron (Fe), Germanium (Ge), or Gallium (Ga) or a combination of them). In some embodiments, FM 101 comprises one or more of Co, Fe, Ni alloys and multilayer hetero-structures, various oxide ferromagnets, garnets, or Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, $MnGa$, or $MnGaRu$.

FIG. 1B illustrates magnetization plot 120 for paramagnet 121. Plot 120 shows the magnetization response to an applied magnetic field for paramagnet 121. The x-axis of plot 120 is magnetic field 'H' while the y-axis is magnetization 'm'. A paramagnet, as opposed to a ferromagnet, exhibits magnetization when a magnetic field is applied to it. Paramagnets generally have magnetic permeability greater or equal to one and hence are attracted to magnetic fields. Compared to plot 100, the magnetic plot 120 of FIG. 1B does not exhibit hysteresis which allows for faster switching speeds and smaller switching energies between the two saturated magnetization configurations 124 and 126 of curve 122. In the middle region 125, paramagnet 121 does not have any magnetization because there is no applied magnetic field (e.g., H=0). The intrinsic energy associated with switching is absent in this case.

In some embodiments, paramagnet 121 comprises a material which includes one or more of: Platinum(Pt), Palladium (Pd), Tungsten (W), Cerium (Ce), Aluminum (Al), Lithium (Li), Magnesium (Mg), Sodium (Na), $Cr_2O_3$ (chromium oxide), CoO (cobalt oxide), Dysprosium (Dy), $Dy_2O$ (dysprosium oxide), Erbium (Er), $Er_2O_3$ (Erbium oxide), Europium (Eu), $Eu_2O_3$ (Europium oxide), Gadolinium (Gd), Gadolinium oxide ($Gd_2O_3$), FeO and $Fe_2O_3$ (Iron oxide), Neodymium (Nd), $Nd_2O_3$ (Neodymium oxide), $KO_2$ (potassium superoxide), praseodymium (Pr), Samarium (Sm), $Sm_2O_3$ (samarium oxide), Terbium (Tb), $Tb_2O_3$ (Terbium oxide), Thulium (Tm), $Tm_2O_3$ (Thulium oxide), or $V_2O_3$ (Vanadium oxide). In some embodiments, paramagnet 121 comprises dopants which include one or more of: Ce, Cr, Mn, Nb, Mo, Tc, Re, Nd, Gd, Tb, Dy, Ho, Er, Tm, or Yb. In various embodiments, the magnet can be either a FM or a paramagnet.

FIG. 1C illustrates plot 130 showing magnetization response to applied voltage field for a paramagnet 131 connected to a magnetoelectric layer 132. Here, the x-axis is voltage 'V' applied across ME layer 132 and y-axis is magnetization 'm'. Ferroelectric polarization "PFE" in ME layer 132 is indicated by an arrow. In this example, magnetization is driven by exchange bias exerted by a ME effect from ME layer 132. When positive voltage is applied to ME layer 132, paramagnet 131 establishes a deterministic magnetization (e.g., in the +x direction by voltage+$V_c$) as shown by configuration 136. When negative voltage is applied by ME layer 132, paramagnet 131 establishes a deterministic magnetization (e.g., in the −x direction by voltage−$V_c$) as shown by configuration 134. Plot 130 shows that magnetization functions 133a and 133b have hysteresis. In some embodiments, by combining ME layer 132 with paramagnet 131, switching speeds of paramagnet as shown in FIG. 1B are achieved. In some embodiments, the hysteresis behavior of magnet 131, as shown in FIG. 1C, is associated with the driving force of switching rather than the intrinsic resistance of the magnet to switching. In some embodiments, the paramagnet 131 can be replaced with a ferromagnet such as FM 101.

FIG. 2A illustrates a magnetoelectric spin orbit logic (SOL) or MESO logic 200 with a capacitive device, according to some embodiments of the disclosure. FIG. 2B illustrates a material stack at the input of an interconnect, according to some embodiments of the disclosure. FIG. 2C illustrates a magnetoelectric SOL material stack at the output of an interconnect, according to some embodiments of the disclosure. FIG. 2E illustrates a cross-section 250 of an input portion of the MESO logic of FIG. 2A, in accordance with some embodiments.

In some embodiments, MESO logic 200 comprises a first magnet 201, a stack of layers (e.g., layers 202, 203, and 204, also labeled as 202a/b, 203a/b, and 204a/b, respectively) a portion of which is/are adjacent to first magnet 201, interconnecting conductor 205 (e.g., a non-magnetic charge conductor), magnetoelectric (ME) layer 206 (206a/b), second magnet 207, and spin filter 215 comprising layers 212, 213, and 214 (212a/b, 213a/b, and 214a/b).

In some embodiments, first and second magnets 201 and 207, respectively, have in-plane magnetic anisotropy. In some embodiments, first and second magnets 201 and 207 are paramagnets. In some embodiments, materials for first and second paramagnets 201 and 207 have saturated magnetization $M_s$ and effective anisotropy field $H_k$. Saturated magnetization $M_s$ is generally the state reached when an increase in applied external magnetic field H cannot increase the magnetization of the material. Anisotropy $H_k$ generally refers material properties that are highly directionally dependent. In some embodiments, materials for first and second paramagnets 201 and 207 are non-ferromagnetic elements with strong paramagnetism which have high number of unpaired spins but are not room temperature ferromagnets.

In some embodiments, first and second paramagnets 201 and 207 comprise a material which includes one or more of: Platinum(Pt), Palladium (Pd), Tungsten (W), Cerium (Ce), Aluminum (Al), Lithium (Li), Magnesium (Mg), Sodium (Na), $Cr_2O_3$ (chromium oxide), CoO (cobalt oxide), Dysprosium (Dy), $Dy_2O$ (dysprosium oxide), Erbium (Er), $Er_2O_3$ (Erbium oxide), Europium (Eu), $Eu_2O_3$ (Europium oxide), Gadolinium (Gd), Gadolinium oxide ($Gd_2O_3$), FeO and $Fe_2O_3$ (Iron oxide), Neodymium (Nd), $Nd_2O_3$ (Neodymium oxide), $KO_2$ (potassium superoxide), praseodymium (Pr), Samarium (Sm), $Sm_2O_3$ (samarium oxide), Terbium (Tb), $Tb_2O_3$ (Terbium oxide), Thulium (Tm), $Tm_2O_3$ (Thulium oxide), and $V_2O_3$ (Vanadium oxide). In some embodiments, the first and second paramagnets 201 and 207 comprise dopants which include one or more of: Ce, Cr, Mn, Nb, Mo, Tc, Re, Nd, Gd, Tb, Dy, Ho, Er, Tm, or Yb.

In some embodiments, first and second magnets 201 and 207 are ferromagnets. In some embodiments, first and second magnets 201 and 207 are free ferromagnets that are made from CFGG (e.g., Cobalt (Co), Iron (Fe), Germanium (Ge), or Gallium (Ga) or a combination of them). In some embodiments, first and second magnets 201 and 207 are free magnets that are formed from Heusler alloy(s). Heusler alloy is ferromagnetic metal alloy based on a Heusler phase. Heusler phase is intermetallic with certain composition and face-centered cubic (FCC) crystal structure. The ferromagnetic property of the Heusler alloy is a result of a double-exchange mechanism between neighboring magnetic ions.

In some embodiments, first and second magnets 201 and 207 are Heusler alloy lattices matched to Ag (e.g., the Heusler alloy is engineered to have a lattice constant close (e.g., within 3%) to that of Ag or to a rotated lattice). In some embodiments, the direction of the spin polarization is determined by the magnetization direction of first magnet 201. In some embodiments, the magnetization direction of second magnet 207 depends on the direction of the strain provided by ME layer 206, which in turn depends on the direction of an input charge current $I_{charge}$ (IN).

In some embodiments, first and second magnets 201 and 207 are formed of Heusler alloy, Co, Fe, Ni, Gd, B, Ge, Ga, or a combination of them. In some embodiments, Heusler alloys that form first and second magnets 201 and 207 include one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

In some embodiments, ME layer 206a is adjacent to magnet 207. In some embodiments, conductor 205 (or charge interconnect) is coupled to at least a portion of the stack of layers and ME layer 206a. For example, conductor 205 is coupled to layer 204a of the stack.

In some embodiments, the stack of layers is to provide an inverse Rashba-Edelstein effect (or inverse spin Hall effect). The stack of layers here is also referred to as the spin-to-charge (SO) conversion module. In some embodiments, the stack of layers provides spin-to-charge conversion where a spin current's (or spin energy $J_s$) is injected from first magnet 201 (also referred to as the input magnet) and charge current $I_c$ is generated by the stack of layers. This charge current $I_c$ is provided to conductor 205 (e.g., charge interconnect). In contrast to spin current, charge current does not attenuate in conductor 205. The direction of the charge current $I_c$ depends on the direction of magnetization of first magnet 201. In some embodiments, the charge current $I_c$ charges the capacitor around ME layer 206a and switches its polarization. ME layer 206a exerts exchange bias on second magnet layer 207, and the direction of the exchange bias determines the magnetization of second magnet 207.

In this example, the length of first magnet is $L_m$, the width of conductor 205 is $W_c$, the length of conductor 205 from the interface of layer 204 to ME layer 206a is $L_c$, $t_c$ is the thickness of the magnets 201 and 207, and $t_{ME}$ is the thickness of ME layer 206a. In some embodiments, conductor 205 comprises a material including one of: Cu, Ag, Al, Au, Co, W, Ta, Ni, graphene. In some embodiments, both magnets 201 and 207 have the same thickness and/or width. In some embodiments, magnets 201 and 207 may have different thickness and/or widths.

In some embodiments, the input and output charge conductors (211a and 211b, respectively) and associated spin-to-charge and charge-to-spin converters are provided. In some embodiments, input charge current $I_{charge(IN)}$ is provided on interconnect 211a (e.g., charge interconnect made of same material as interconnect 205). In some embodiments, interconnect 211a is coupled to first magnet 201 via ME layer 206b. In some embodiments, interconnect 211a is orthogonal to first magnet 201. For example, interconnect 211a extends in the +x direction while first magnet 201 extends in the −y direction. In some embodiments, $I_{charge(IN)}$ is converted to corresponding magnetic polarization of 201 by ME layer 206b. The materials for ME layers 206a/b are the same as the materials of ME layer 206.

In some embodiments, an output interconnect 211b is provided to transfer output charge current $I_{charge(OUT)}$ to another logic or stage. In some embodiments, output interconnect 211b is coupled to second magnet 207 via a stack of layers that exhibit spin Hall effect and/or Rashba Edelstein effect. For example, layers 202b, 203b, and 204b are provided as a stack to couple output interconnect 211b with second magnet 207. Material wise, layers 202b, 203b, and 204b are formed of the same material as layers 202a, 203a, and 204a, respectively. In some embodiments, the non-magnetic conductors or interconnects 211a/b and 205 include one or more of: Cu, Ag, Al, Au, Co, W, Ta, Ni, or graphene.

In some embodiments, a transistor (e.g., p-type transistor MP1) is coupled to magnet 201. In this example, the source terminal of transistor MP1 is coupled to a supply $V_{dd}$, the gate terminal of transistor MP1 is coupled to a control voltage $V_{cl}$ (e.g., a switching clock signal, which switches between $V_{dd}$ and ground), and the drain terminal of transistor MP1 is coupled to magnet 201. In some embodiments, the current $I_{drive}$ from transistor MP1 generates spin current into the stack of layers (e.g., layers 202a, 203a, and 204a).

In some embodiments, along with the p-type transistor MP1 connected to $V_{dd}$ (or an n-type transistor connected to $V_{dd}$ but with gate overdrive above $V_{dd}$), an n-type transistor MN1 is provided which couples to magnet 201, where the n-type transistor is operable to couple ground (or 0 V) to magnet 201. In some embodiments, n-type transistor MN2 is provided which is operable to couple ground (or 0 V) to magnet 207.

In some embodiments, p-type transistor MP2 is provided which is operable to couple power supply ($V_{dd}$ or $-V_{dd}$) to magnet 207. For example, when clock is low (e.g., $V_{cl}=0$ V), then transistor MP1 is on and $V_{dd}$ is coupled to magnet 201 (e.g., power supply is $V_{dd}$) and 0 V is coupled to magnet 207. This provides a potential difference for charge current to flow. Continuing with this example, when clock is high (e.g., $V_{cl}=V_{dd}$ and power supply is $V_{dd}$), then transistor MP1 is off, transistor MN1 is on, and transistor MN2 is off. As such, 0 V is coupled to magnet 201 while $V_{dd}$ is coupled to magnet 207.

In some embodiments, the power supply is a negative power supply (e.g., $-V_{dd}$). In that case, the source of transistor MP1 is connected to 0 V, and the source of transistor MN1 is connected to $-V_{dd}$, and transistor MN2 is on. When $V_{cl}=0$ V and power supply is $-V_{dd}$, then transistor MN1 is on, and transistor MP1 is off, and transistor MN2 (whose source is at $-V_{dd}$) is off and transistor MP2 whose source is 0 V is on. In this case, $-V_{dd}$ is coupled to input magnet 201 and 0 V is coupled to output magnet 207. This also provides a path for charge current to flow. Continuing with this example, when clock is high (e.g., $V_{cl}=-V_{dd}$ and power supply is $-V_{dd}$), then transistor MP1 is off, transistor MN1 is on, and transistor MN2 is off. As such, 0 V is coupled to input magnet 201.

In some embodiments, ME layer 206a/b forms the magnetoelectric capacitor to switch the magnets 207/201, respectively. For example, conductor 205 forms one plate of the capacitor, magnet 207 forms the other plate of the capacitor, and layer 206a is the magnetic-electric oxide that provides exchange bias to magnet 207. In some embodiments, switching of magnets 207 and 201 occurs because the magnetoelectric oxide exerts exchange bias originating from partially compensated anti-ferromagnetism in the magneto-electric oxide.

In some embodiments, first magnet 201 injects a spin polarized current into the high spin-orbit coupling (SOC) material stack (e.g., layers 202a, 203a, and 204a) via spin filter structure 215 (also referred to as symmetric tunneling barrier). The spin polarization is determined by the magnetization of first magnet 201.

In some embodiments, spin filter structure 215 comprises a first magnet 214a, a barrier structure 213a/b, and a second magnet 212a/b, wherein the barrier structure 213a/b is between first and second magnets 214a and 212a. In various embodiments, when the magnetization of magnets 201/207 switches (which depends on the direction of the input charge current $I_{charge(IN)}$), the magnets 214a and 212a of the spin filter structure 215 also switch in the same direction. In this example, magnets 212a and 214a are free magnets.

In various embodiments, the magnetization of magnets 201/207 is in-plane (e.g., along the x-y plane of the MESO device), and the magnetization of magnets 212a/b and 214a/b is also in-plane. In some embodiments, the magnetization of magnets 201/207 is out-of-plane (e.g., along the y-z plane of the MESO device), and the magnetization of magnets 212a/b and 214a/b is also out-of-plane. Various embodiments here, however, are described with reference to magnets being in-plane magnets.

In SO module (e.g., the SOC material stack), the SO material normally has the different crystal structure to the magnet (e.g., magnets 201 or 207). Upon growing tunneling barrier 212a directly on the SO material, the crystal structure of tunneling barrier will follow the crystal structure of the SO material. Then the crystal structure of the magnet 201/207 and tunneling barrier are not matched. In some embodiments, spin filter stack 215 or a symmetric tunneling barrier is inserted between the SOC material stack the magnet 201/207 to boost the output of the SO module. In some embodiments, the crystal structure of magnets 212a/b and the barrier structure 213a/b are the same.

In some embodiments, the thicknesses $t_C$ and $t_A$ of magnets 212a/b and 214a/b, respectively, are in a range of 0.5 nm (nanometer) to 2 nm. In some embodiments, the thickness $t_B$ of the barrier structure is in a range of 0.5 nm to 2 nm.

The spin filter stack 215 can comprise a symmetric tunneling barrier or a spinel material, in accordance with some embodiments.

In the case when spin filter stack 215 may comprise a symmetric tunneling barrier, layer 213a/b is a tunneling barrier, whose crystal structure is the same the crystal structure of layer 212a/b. In some embodiments, layer 214a/b is a thin ferromagnetic layer, whose magnetization is coupled to the magnetization of magnets 201/207. For example, layer 214a/b is a free magnet whose magnetization is same as the magnetization of magnets 201/207. In various embodiments, the layers 212a/b, 213a/b, and 214a/b have the same crystal structure. For example, all layers 212a/b, 213a/b, and 214a/b have face centered cubic (FCC) lattice.

In some embodiments, when applying current to magnet 201/207 through to the SO module, the interface polarization can be improved from approximately 20% to approximately 80% due to the spin filter stack 215. Here, interface polarization is the polarization along the interface of magnet 201/207 and the adjacent layer. In some embodiments, tunneling barrier layer 212a/b comprises one of MgO and $Al_2O_3$ which are FCC crystal structures. Layer 212a in this case can comprise any FCC material. For example, layer 212a comprises CoFeB or CoFe material. In some embodiments, layer 214a/b can use any FCC ferromagnet such as CoFeB and CoFe. In some embodiments, when magnets 201/207 have FCC lattice structure, then layer 214a/b which is directly coupled to the magnets 201/207, may not be needed.

In the case when spin filter stack 215 may comprise a spinel tunneling barrier, and any spinel type of ferromagnet for layer 212a/b and material for layer 214a/b. For this spinel type of stack 215, the interface polarization can also be improved from approximately 20% to approximately 80%. Typically, material of $AB_2O_4$ is a spinel tunneling barrier and Fe is a spinel ferromagnet. For example, $MgAl_2O_4$, $ZnFe_2O_4$, $NiFe_2O_4$, and $CoFe_2O_4$ are well-known materials of type $AB_2O_4$ that can be used for spinel tunneling barrier 213/b. In one such embodiment, Fe and its alloy can be used for forming layers 212a/b and 214a/b. In some embodiments, when layer 213a/b is of a spinel type, then body centered cubic lattice (BCC) based magnetic materials (e.g., Fe and its alloys) can be used for layers 212a/b and 214a/b. In some embodiments, when magnets 201/207 are already one kind of spinel magnets, then layer 214a/b may not be needed.

In some embodiments, additional coupling layer 216 can be inserted between the spin filter stack 215 and the SOC stack of materials. Materials for coupling layer 216 includes one or more of: Ru, Os, Hs, Fe, or other similar transition metals from the platinum group of the periodic table.

In some embodiments, the stack for the SO module comprises i) an interface 203 with a high density 2D (two dimensional) electron gas and with high SOC formed between 202 and 204 materials such as Ag or Bi, or ii) a bulk material 204 with high spin Hall effect (SHE) coefficient such as Ta, W, or Pt. In some embodiments, a spacer (or template layer) is formed between first magnet 201 and the injection stack. In some embodiments, this spacer is a templating metal layer which provides a template for forming first magnet 201. In some embodiments, the metal of the spacer which is directly coupled to magnet 212a/b of the spin filter 215 is a noble metal (e.g., Ag, Cu, or Au) doped with other elements from Group 4d and/or 5d of the Periodic Table.

In some embodiments, first magnet 201 is sufficiently lattice matched to Ag (e.g., a material which is engineered to have a lattice constant close (e.g., within 3%) to that of Ag).

Here, sufficiently matched atomistic crystalline layers refer to matching of the lattice constant 'a' within a threshold level above which atoms exhibit dislocation which is harmful to the device (for instance, the number and character of dislocations lead to a significant (e.g., greater than 10%) probability of spin flip while an electron traverses the interface layer). For example, the threshold level is within 5% (i.e., threshold levels in the range of 0% to 5% of the relative difference of the lattice constants). As the matching improves (e.g., matching gets closer to perfect matching), spin injection efficiency from spin transfer from first magnet 201 to first ISHE/ISOC stacked layer increases. Poor matching (e.g., matching worse than 5%) implies dislocation of atoms that is harmful for the device.

Table 1 summarizes transduction mechanisms for converting magnetization to charge current and charge current to magnetization for bulk materials and interfaces.

TABLE 1

Transduction mechanisms for Spin to
Charge and Charge to Spin Conversion

|  | Spin → Charge | Charge → Spin |
| --- | --- | --- |
| Bulk | Inverse Spin Hall Effect | Magnetoelectric effect |
| Interface | Inverse Rashba-Edelstein Effect | Magnetoelectric effect |

The following section describes the spin-to-charge and charge-to-spin dynamics. In some embodiments, the spin-orbit mechanism responsible for spin-to-charge conversion is described by the inverse Rashba-Edelstein effect in 2D electron gases. The Hamiltonian (energy) of spin-orbit coupling electrons in a 2D electron gas is:

$$H_R = \alpha_R(k \times \hat{z}) \cdot \vec{\sigma}$$

where $\alpha_R$ is the Rashba-Edelstein coefficient, 'k' is the operator of momentum of electrons, $\hat{z}$ is a unit vector perpendicular to the 2D electron gas, and $\vec{\sigma}$ is the vector operator of spin of electrons.

The spin polarized electrons with direction of polarization in-plane (e.g., in the xy-plane) experience an effective magnetic field dependent on the spin direction:

$$\vec{B}(\vec{k}) = \frac{\alpha_R}{\mu_B}\left(\vec{k} \times \hat{z}\right)$$

where $\mu_B$ is the Bohr magneton.

This results in the generation of a charge current L in interconnect 205 proportional to the spin current $I_s$ (or $J_s$). The spin-orbit interaction by Ag and Bi interface layers 202 and 204 (e.g., the Inverse Rashba-Edelstein Effect (IREE)) produces a charge current $I_c$ in the horizontal direction given as:

$$I_c = \frac{\lambda_{IREE} I_s}{w_m}$$

where $w_m$ is width of the input magnet 201, and $\lambda_{IREE}$ is the IREE constant (with units of length) proportional to $\alpha_R$.

Alternatively, the Inverse Spin Hall Effect in Ta, W, or Pt layer 203 produces the horizontal charge current $I_c$ given as:

$$I_c = \frac{\Theta_{SHE} t_{SHE} I_s}{2w_m}$$

Both IREE and ISHE effects produce spin-to-charge current conversion around 0.1 with existing materials at 10 nm (nanometers) magnet width. For scaled nanomagnets (e.g., 5 nm wide magnets) and exploratory SHE materials such as $Bi_2Se_3$, the spin-to-charge conversion efficiency can be between 1 and 2.5. The net conversion of the drive charge current $I_{drive}$ to magnetization dependent charge current is given as:

$$I_c = \pm \frac{\lambda_{IREE} P I_s}{w_m} \text{ for } IREE \text{ and } I_c = \pm \frac{\Theta_{SHE} t_{SHE} P I_s}{2w_m} \text{ for } ISHE$$

where is the dimensionless spin polarization. For this estimate, the drive current $I_{drive}$ and the charge current $I_c=I_d=100$ μA is set. As such, when estimating the resistance of the ISHE interface to be equal to R=100Ω, then the induced voltage is equal to $V_{ISHE}=10$ mV.

In various embodiments, the spin filter stack 215 boosts spin current $I_s$ which in turn boosts the charge current $I_c$ generated by the SOC stack.

The charge current $I_c$, carried by interconnect 205, produces a voltage on the capacitor of ME layer 206a comprising magnetoelectric material dielectric (such as $BiFeO_3$ (BFO) or $Cr_2O_3$) in contact with second magnet 207 (which serves as one of the plates of the capacitor) and interconnect 205 (which series as the other of the plates of the capacitor). In some embodiments, magnetoelectric materials are either intrinsic multiferroic or composite multiferroic structures. As the charge accumulates on the magnetoelectric capacitor of ME layer 206a, a strong magnetoelectric interaction causes the switching of magnetization in second magnet 207. For the following parameters of the magnetoelectric capacitor: thickness $t_{ME}=5$ nm, dielectric constant ε=500, area A=60 nm×20 nm. Then the capacitance is given as:

$$C = \frac{\varepsilon \varepsilon_0 A}{t_{ME}} \approx 1 fF$$

Demonstrated value of the magnetoelectric coefficient is $\alpha_{ME} \sim 10/c$, where the speed of light is c. This translates to the effective magnetic field exerted on second magnet 207, which is expressed as:

$$B_{ME} = \alpha_{ME} E = \frac{\alpha_{ME} V_{ISHE}}{t_{ME}} \sim 0.06 T$$

This is a strong field sufficient to switch magnetization.

The charge on the capacitor of ME layer 206a is $$Q = \frac{1}{fF} \times 10 \text{ mV} = 10 \text{ aC,}$$

and the time to fully charge it to the induced voltage is $$td = 10 \frac{Q}{I_d} \sim 1 \text{ ps}$$

with the account of decreased voltage difference as the capacitor charges). If the driving voltage is $V_d=100$ mV, then the energy $E_{sw}$ to switch is expressed as:

$$E_{sw} \sim 100 mV \times 100 \mu A \times 1 ps \sim 10 aJ$$

which is comparable to the switching energy of CMOS transistors. Note that the time to switch $t_{sw}$ magnetization remains much longer than the charging time and is determined by the magnetization precession rate. The micromagnetic simulations predict this time to be $t_{sw} \sim 100 ps$, for example.

In some embodiments, materials for first and second magnets 201 and 207 have saturated magnetization $M_s$ and effective anisotropy field $H_k$. Saturated magnetization $M_s$ is generally the state reached when an increase in applied external magnetic field H cannot increase the magnetization of the material. Anisotropy $H_k$ generally refers material properties that are highly directionally dependent. In some embodiments, materials for first and second magnets 201 and 207 are non-ferromagnetic elements with strong paramagnetism which have high number of unpaired spins but are not room temperature ferromagnets.

In some embodiments, the stack of layers comprises: a first layer 202 comprising Ag, wherein the first layer is adjacent to magnet 212a/b; and a second layer 204 comprising Bi or W, wherein second layer 204 is adjacent to first layer 202 and to conductor 205. In some embodiments, a third layer 203 (having material which is one or more of Ta, W, or Pt) is sandwiched between first layer 202 and second layer 204 as shown. In some embodiments, the stack of layers comprises a material which includes one of: β-Ta, β-W, W, Pt, Cu doped with Iridium, Cu doped with Bismuth, or Cu doped an element of 3d, 4d, 5d, 4f, or 5f of periodic table groups, $Bi_2Se_3$, $Bi_2Te_3$, $Bi_2Se_yTe_{3-y}$, alfa-Sn, or Tungsten Oxide, or materials with spin orbit effects.

In some embodiments, ME layer 206a/b is formed of a material which includes one of: Cr, O, $Cr_2O_3$, Boron doped $Cr_2O_3$ or multiferroic material. In some embodiments, ME layer 206 comprises Cr and O. In some embodiments, the multiferroic material comprises BFO (e.g., $BiFeO_3$), LFO ($LuFeO_2$, $LuFe_2O_4$), or La doped $BiFeO_3$. In some embodiments, the multiferroic material includes one of: Bi, Fe, O, Lu, or La.

In some embodiments, ME layer 206 comprises one of dielectric material, para-electric material or ferro-electric material.

In some embodiments, the dielectric material includes one of: $HfO_2$, $SiO_2$, $HfZrO_2$, $Al_2O_3$, $SrTiO_3$, $LaSrMoO_3$, or their super lattices. For example, dielectric material may have super lattice of any of two or more layers of material in an alternating fashion, where the layers of material includes layer of: $HfO_2$, $SiO_2$, $HfZrO_2$, $Al_2O_3$, $SrTiO_3$, or $LaSrMoO_3$. In some embodiments, the dielectric material includes one of the following elements: Hf, O, Si, Zr, Al, Sr, Ti, La, or Mo. In some embodiments, the para-electric material includes one of: $Cr_2O_3$, doped $HfZrO_3$. In some embodiments, the para-electric material includes one of the following elements: Cr, O, Hf, or Zr. In some embodiments, the ferroelectric material includes one of: $BiFeO_3$, $SrTiO_3$, $LaAlO_3$, $HfZrO_3$, or $HfSiO_3$. In some embodiments, the ferroelectric material includes one of the following elements: Bi, Fe, O, Sr, Ti, La, Al, Hf, Zr, or Si.

FIG. 3 illustrates magnetoelectric SOL 300 operable as a repeater (or buffer), according to some embodiments. It is pointed out that those elements of FIG. 3 having the same reference numbers (or names) as the elements of any other figure can operate or function in any manner similar to that described, but are not limited to such. In some embodiments, to configure the SOL 200 as a repeater, a negative supply (e.g., $V_{dd}<0$) is applied to transistors MP1 and MP2. For example, magnet 201 is coupled to $V_{dd}$ via transistor MP1 while magnet 207 is coupled to ground via transistor MN2. In some embodiments, for repeater SOL 300, the magnetization direction of first magnet 201 is the same as the magnetization direction of second magnet 207. For example, the magnetization direction of first magnet 201 is in the +y direction while the magnetization direction of second magnet 207 is also in the +y direction.

Figure 4:
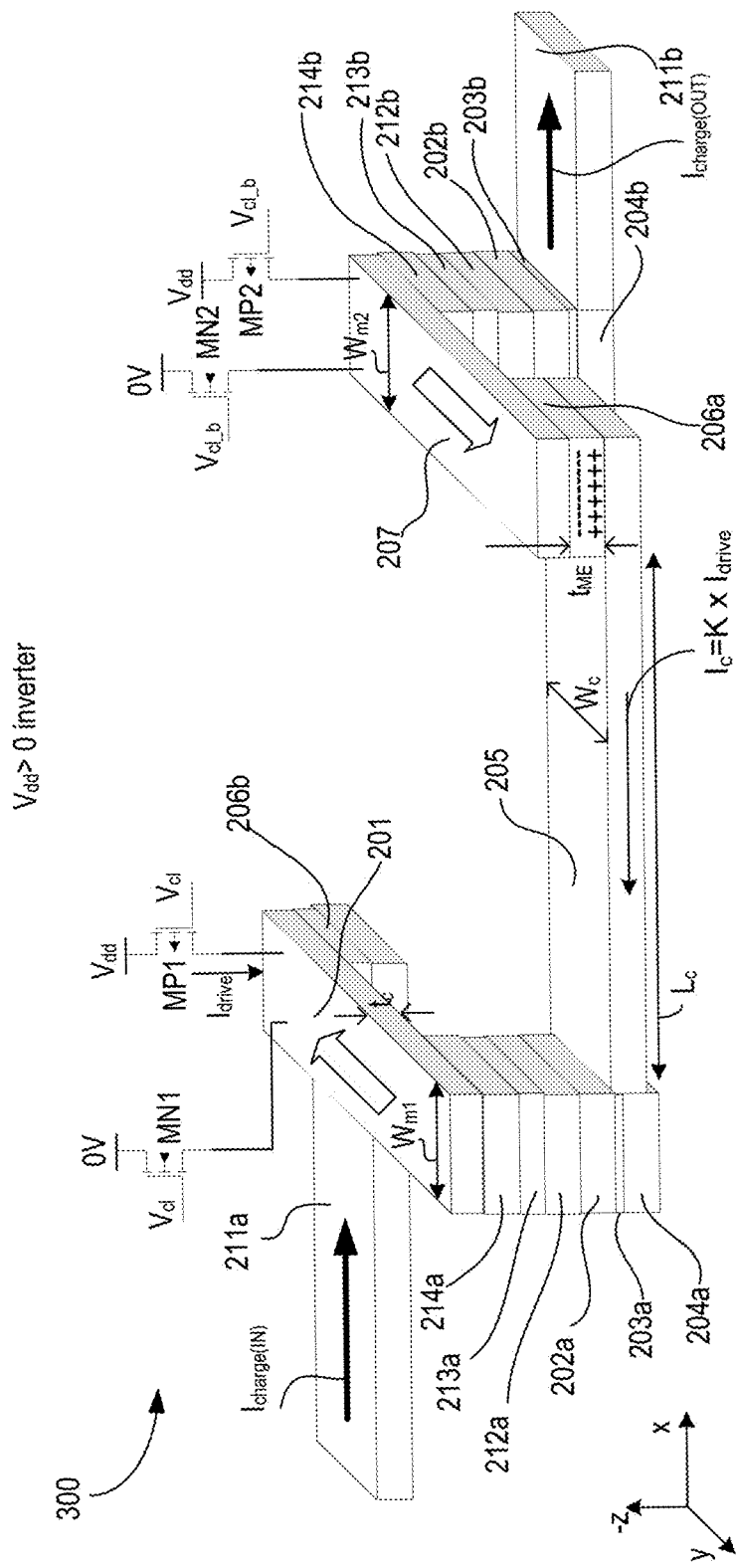
FIG. 4 illustrates a MESO logic operable as an inverter, according to some embodiments.

FIG. 4 illustrates magnetoelectric SOL 400 operable as an inverter, according to some embodiments. It is pointed out that those elements of FIG. 4 having the same reference numbers (or names) as the elements of any other figure can operate or function in any manner similar to that described, but are not limited to such. In some embodiments, to configure the SOL 200 as an inverter, a positive supply (e.g., $V_{dd}>0$) is coupled to transistors MP1 and MP2. For example, magnet 201 is coupled to $V_{dd}$ via transistor MP1 while magnet 207 is coupled to ground via transistor MN2. In some embodiments, for inverter SOL 400, the magnetization direction of first magnet 201 is opposite compared to the magnetization direction of second magnets 207. For example, the magnetization direction of first magnet 201 is in the −y direction while the magnetization direction of second magnet 207 is in the +y direction. Note, the positive and negative signs for ME layer 206a capacitance flips between SOL 300 and SOL 400.

MESO devices of various embodiments provide logic cascadability and unidirectional signal propagation (e.g., input-output isolation). The unidirectional nature of logic is ensured due to large difference in impedance for injection path versus detection path, in accordance with some embodiments. In some embodiments, the injector is essentially a metallic spin valve with spin to charge transduction with RA (resistance area) products of approximately 10 mOhm·micron$^2$. In some embodiments, the detection path is a low leakage capacitance with RA products much larger than 1 MOhm·micron$^2$ in series with the resistance of the magnetic capacitor plate with estimated resistance greater than 500 Ohms.

Figure 5:
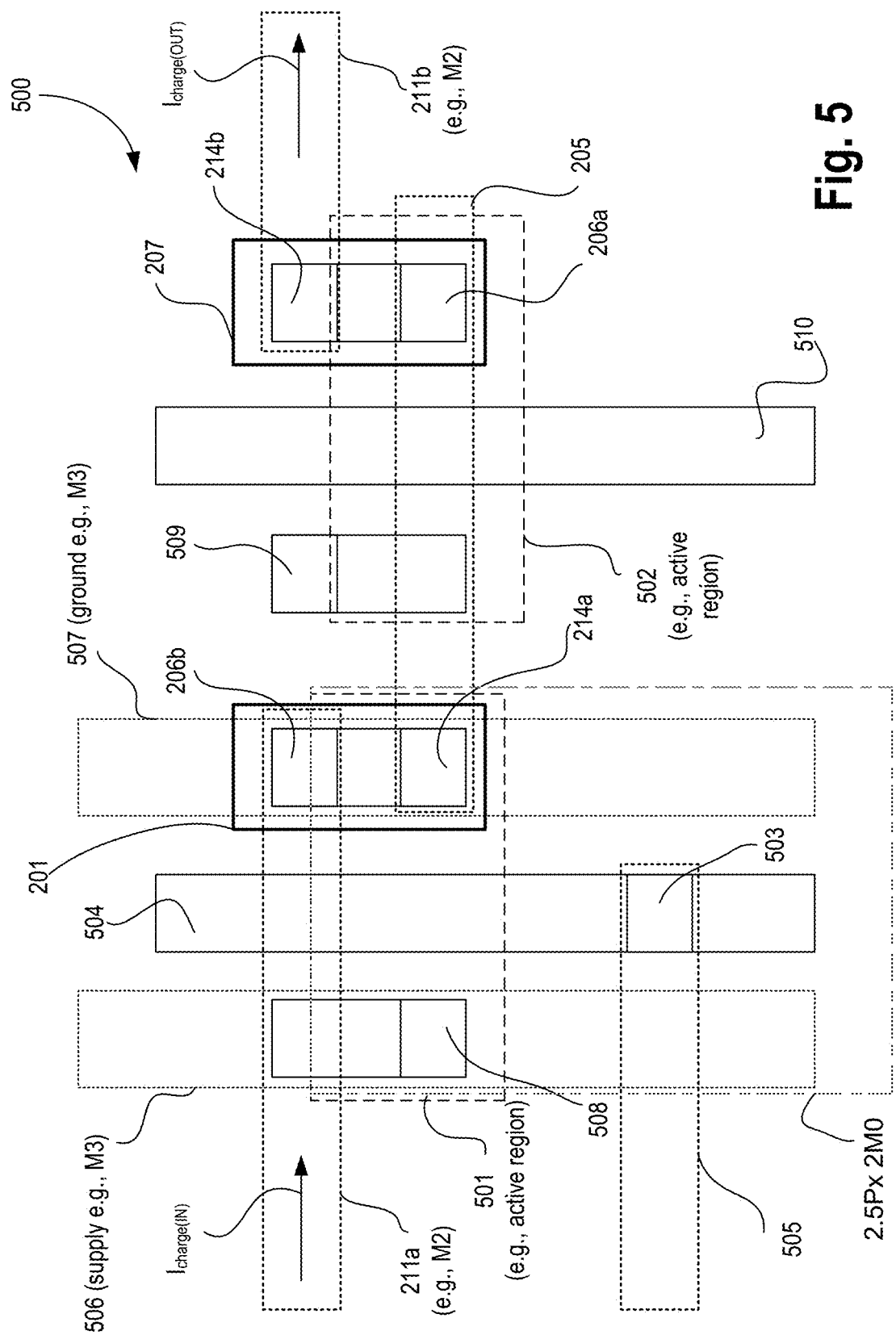
FIG. 5 illustrates a top view of a layout of the MESO logic, according to some embodiments.

FIG. 5 illustrates a top view of layout 500 of MESO logic device 200, according to some embodiments. An integration scheme for SOL devices with CMOS drivers for power supply and clocking is shown in the top view. Here, transistor MP1 is formed in the active region 501, and power supply is provided via metal layer 3 (M3) indicated as 506. The gate terminal 504 of transistor MP1 is coupled to a supply interconnect 505 through via or contact 503. In some embodiments, M3 layer 507 is coupled to ground which provides ground supply to layer 204. In some embodiments, another transistor can be formed in active region 503 with gate terminal 510. Here, regions 508 and 509 are contact vias coupled to a power supply line. In some embodiments, the density of integration of the devices exceeds that of CMOS since an inverter operation can be achieved within 2.5P×2M0. In some embodiments, since the power transistor MP1 can be shared among all the devices at the same clock phases, vertical integration can also be used to increase the logic density as described with reference to FIG. 6, in accordance with some embodiments.

Figure 6:
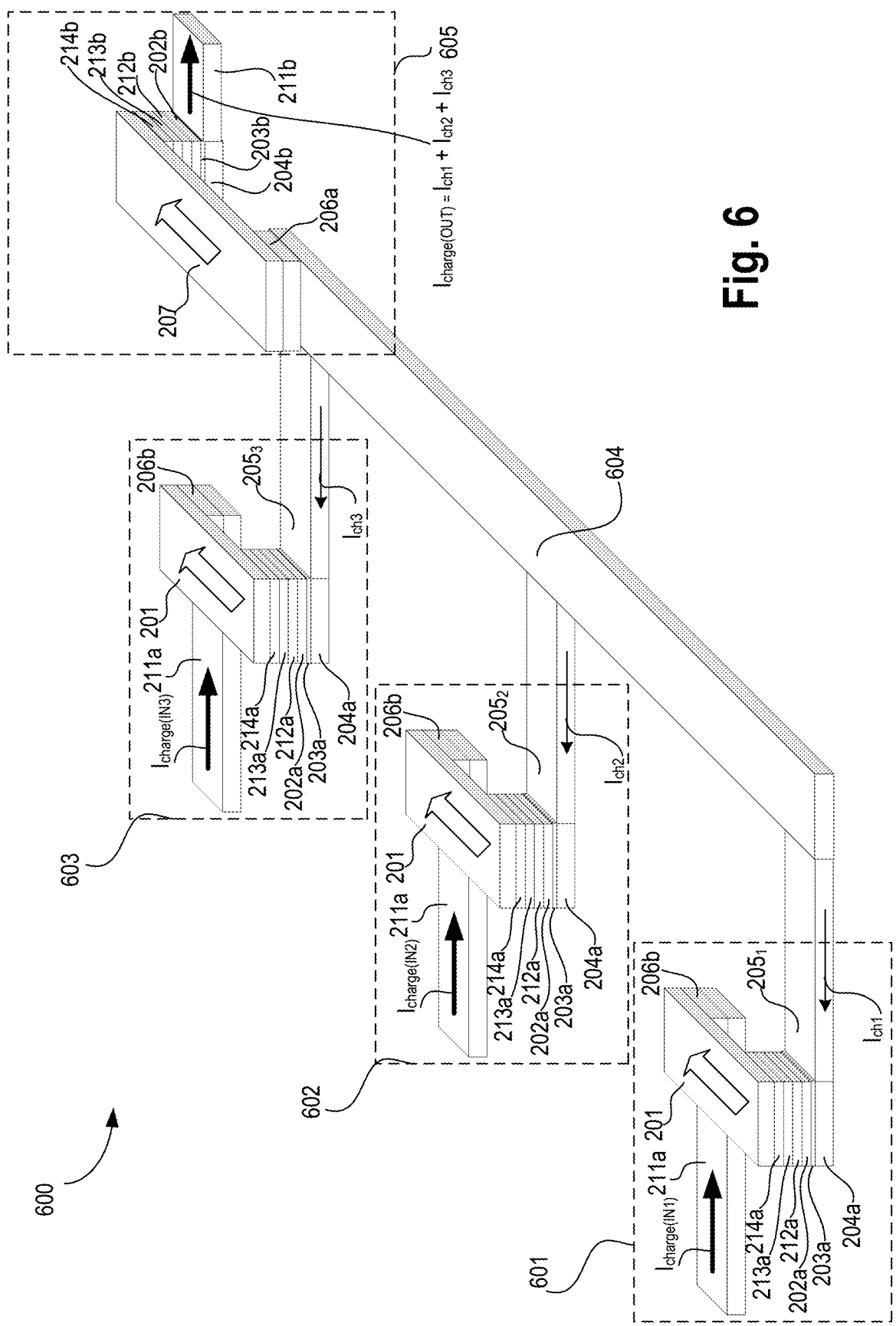
FIG. 6 illustrates a majority gate using MESO logic devices, according to some embodiments.

FIG. 6 illustrates majority gate 600 using magnetoelectric SOL devices, according to some embodiments. It is pointed out that those elements of FIG. 6 having the same reference numbers (or names) as the elements of any other figure can operate or function in any manner similar to that described, but are not limited to such. A charge mediated majority gate is proposed using the spin orbit coupling and magnetoelectric switching. A charge mediated majority gate is shown in FIG. 6. Majority gate 600 comprises at least three input stages 601, 602, and 603 with their respective charge conductors 2051, 2052, and 2053 coupled to summing interconnect 604. In some embodiments, summing interconnect 604 is made of the same materials as interconnect 205. In some embodiments, summing interconnect 604 is coupled to output stage 605 which includes the second magnet 507 (like 207). The three input stages 601, 602, and 603 share a common power/clock region therefore the power/clock gating transistor can be shared among the three inputs of the majority gate, in accordance with some embodiments. The input stages 601, 602, and 603 can also be stacked vertically to improve the logic density, in accordance with some embodiments. The charge current at the output ($I_{charge(OUT)}$) is the sum of currents $I_{ch1}$, $I_{ch2}$, and $I_{ch3}$.

Figure 7:
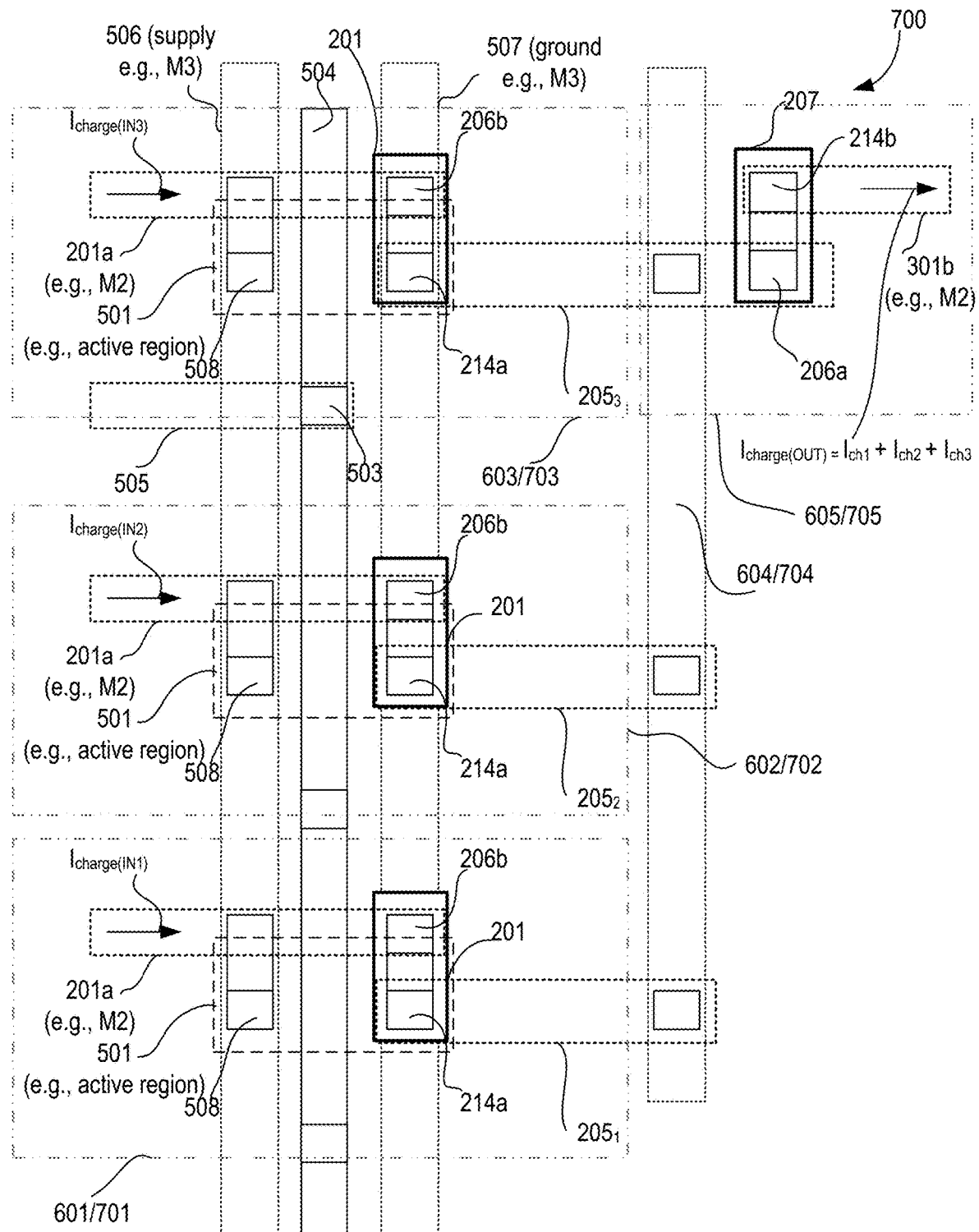
FIG. 7 illustrates a top view of a layout of the majority gate of FIG. 6, according to some embodiments.

FIG. 7 illustrates a top view of layout 700 of majority gate 600, according to some embodiments. It is pointed out that those elements of FIG. 7 having the same reference numbers (or names) as the elements of any other figure can operate or function in any manner similar to that described, but are not limited to such. Majority gate 700 comprises at least three input stages 601/701, 602/702, and 603/703 with their respective conductors 2051, 2052, and 2053 coupled to summing interconnect 604/704 and output stage 605/705.

Figure 8A:
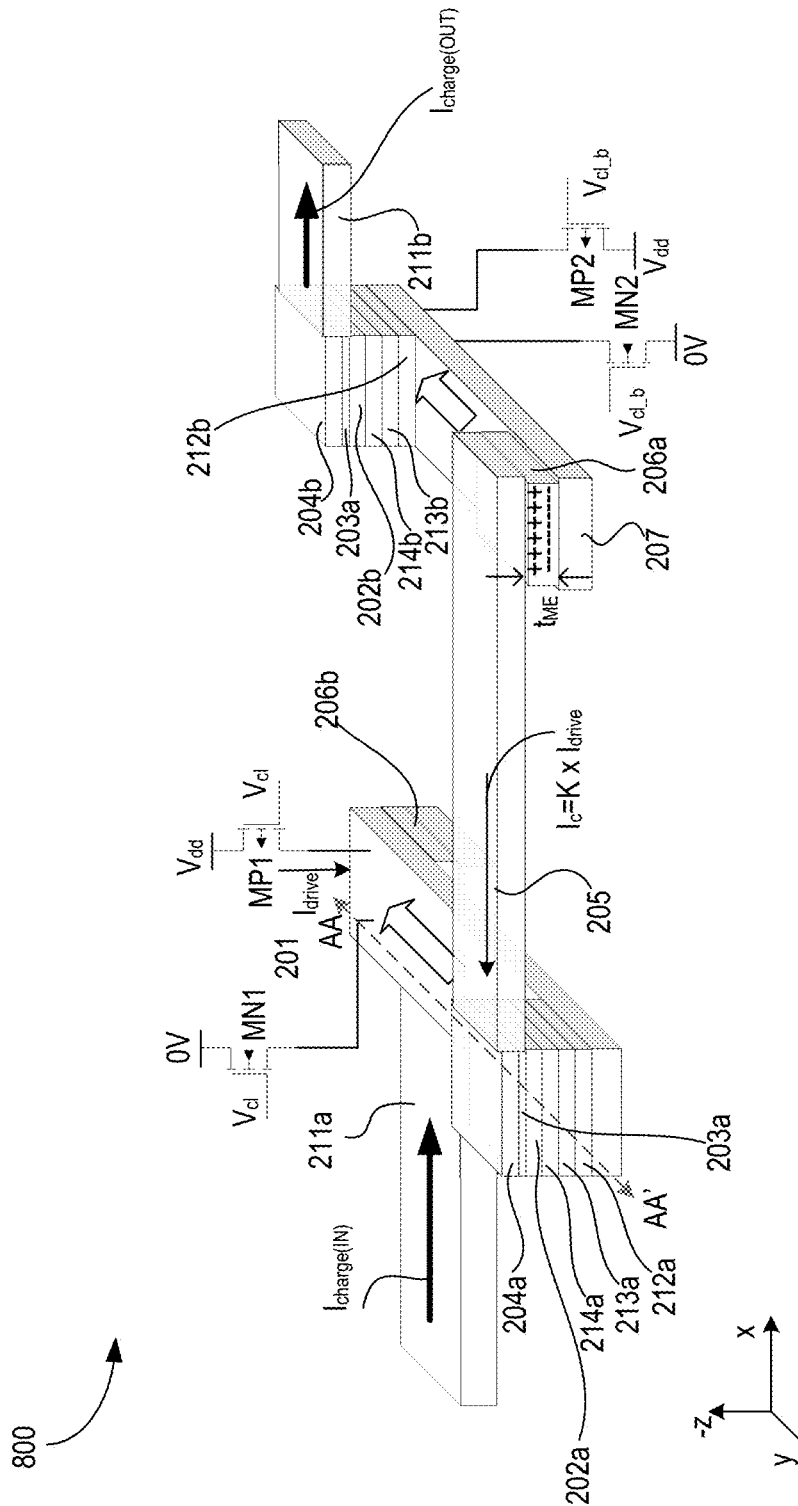
FIG. 8A illustrates a MESO logic with spinel type of tunneling barrier and spinel type of magnet, according to some embodiments of the disclosure.
Figure 8B:
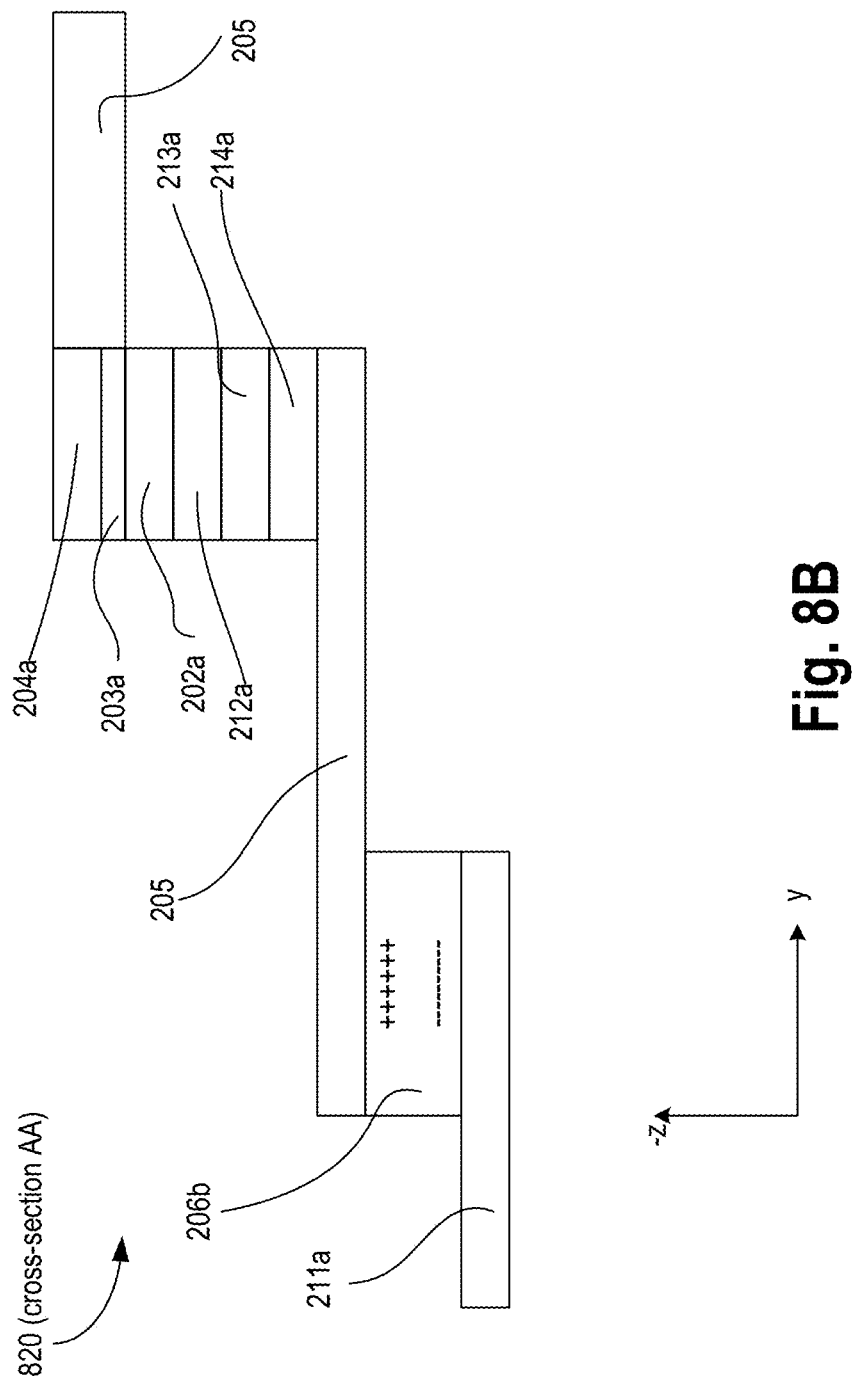
FIG. 8B illustrates a cross-section of an input portion of the MESO logic of FIG. 8A, in accordance with some embodiments.

FIG. 8A illustrates a MESO logic 800 with spinel type of tunneling barrier and spinel type of magnet, according to some embodiments of the disclosure. FIG. 8B illustrates a cross-section 820 of an input portion of the MESO logic of FIG. 8A, in accordance with some embodiments.

MESO logic 800 is similar to MESO logic 200 in operation and technical effect. However, the structures of MESO logic 800 and MESO logic 200 are different. In MESO logic 800, the ME module (e.g., ME structure 206a/b) and the SO module (e.g., SOC stack) are not in the same layer. In some embodiments, the stack of layers forming the spin filter 215 are inversed relative to the stack 215 of FIG. 2A. For example, magnet 214a which was below FM 201 is not above FM 201. The same two types of spin filters can be used for MESO logic 800. For example, spin filter 215 for MESO logic 800 can be a symmetric tunneling barrier type or spinel type.

When the spin filter 215 for MESO logic 800 is a symmetric tunneling barrier type, layers 212a/b, 213a/b, and 214a/b are of the same crystal structure. Layer 214a/b is generally a very thin ferromagnetic layer, which the magnetization is coupled to FM 201/207. Layer 213a/b is a tunneling barrier with a crystal structure that is the same the crystal structure of Layer 214a/b. Layer 212a/b is a very thin layer (e.g., 1 nm), which can be treated as a dead layer and may not impact the SO module. In some embodiments, if FM 201/207 is already the same crystal structure as Layer 212a/b, then Layer 214a/b may not be needed.

When the spin filter 215 for MESO logic 800 is a spinel type having a spinel type of tunneling barrier 213a/b, then any spinel type of ferromagnet for 212a/b and 214a/b can be used. Typically, materials such as $AB_2O_4$ are used for a spinel tunneling barrier 213a/b and Fe and Fe alloys are used for spinel ferromagnet for 212*a/b* and 214*a/b*. If FM is already one kind of spinel magnets, then Layer C is not needed.

FIG. 9 illustrates flowchart 900 of a method for forming a MESO logic with symmetric tunneling barrier or spin filter, according to some embodiments of the disclosure. While various blocks of flowchart 900 are shown in a particular order, the order can be changed. For example, some blocks can be performed before others and some blocks can be performed simultaneously with others.

At block 901, a first magnet 201 is formed. For example, an in-plane free magnet is formed which is coupled to an ME module and then an SO module. At block 902, a second magnet 214*a* is formed adjacent to the first magnet 201. In various embodiments, the second magnet 214*a* is part of a spin filter 215. At block 903, a first structure is formed comprising a tunneling barrier 213*a* which is adjacent to second magnet 214*a*. At block 904, a third magnet 212*a* is formed adjacent to the first structure. At block 905, a stack of layers forming an SO module are fabricated such that a portion of the stack is adjacent to the third magnet. The stack of layers comprises spin orbit coupling material. At block 906, a second structure 206 (the ME module) comprising ME material is formed, wherein the second structure is adjacent to the first magnet 201.

In some embodiments, the method forming the tunneling barrier 213*a* comprises one of: forming a symmetric tunneling barrier which includes one or more of: Mg, Al, or O; or forming a spinel tunneling barrier which includes one or more of: Mg, Al, Zn, Fe, Ni, Co, or O. In some embodiments, the second magnet, the third, magnet, and the symmetric tunneling barrier have face centered cubic (FCC) lattice. In some embodiments, the second and third magnets comprise: Co, Fe, or B. In some embodiments, the second and third magnets have body centered cubic lattice. In some embodiments, the second and third magnets comprises a spinel ferromagnet which includes Fe or an alloy of Fe.

Figure 10:
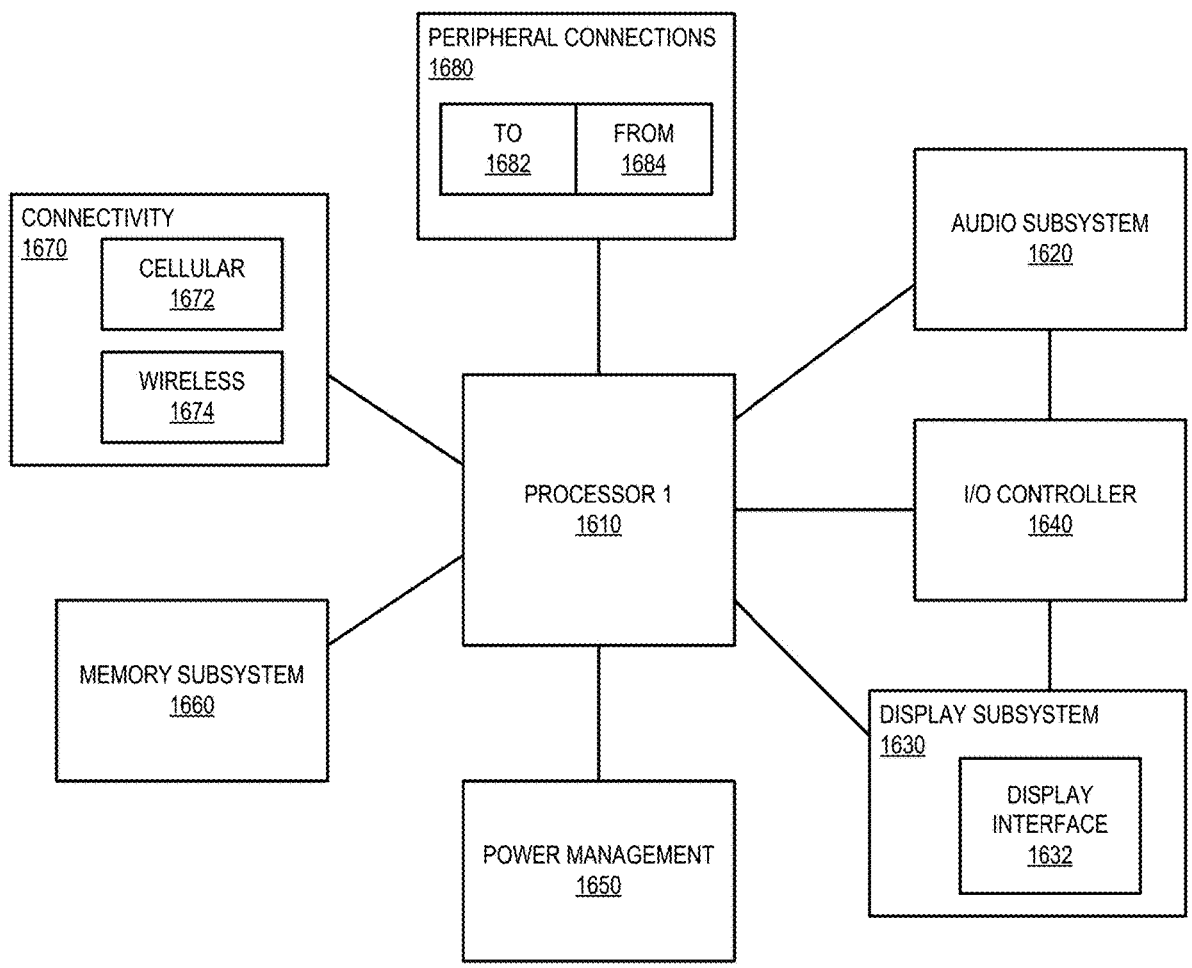
FIG. 10 illustrates a smart device or a computer system or a SoC (System-on-Chip) with MESO logic with symmetric tunneling barrier or spin filter, according to some embodiments.

FIG. 10 illustrates a smart device or a computer system or a SoC (System-on-Chip) 1600 with MESO logic with symmetric tunneling barrier or spin filter, according to some embodiments.

FIG. 10 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with MESO logic with symmetric tunneling barrier or spin filter, according to some embodiments discussed. Other blocks of the computing device 1600 may also include MESO logic with symmetric tunneling barrier or spin filter, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

An apparatus comprising: a first magnet; a second magnet adjacent to the first magnet; a first structure comprising a tunneling barrier; a third magnet adjacent to the first structure; a stack of layers, a portion of which is adjacent to the third magnet, wherein the stack of layers comprises spin-orbit material; and a second structure comprising magneto-electric material, wherein the second structure is adjacent to the first magnet.

Example 2

The apparatus of example 1, wherein the tunneling barrier comprises one of: a symmetric tunneling barrier which includes one or more of: Mg, Al, or O; or a spinel tunneling barrier which includes one or more of: Mg, Al, Zn, Fe, Ni, Co, or O.

Example 3

The apparatus of example 2, wherein the second magnet, the third, magnet, and the symmetric tunneling barrier have face centered cubic (FCC) lattice.

Example 4

The apparatus of example 3, wherein the second and third magnets comprise: Co, Fe, or B.

Example 5

The apparatus of example 2, wherein the second magnet, the third, magnet, and the symmetric tunneling barrier have a same crystalline structure.

Example 6

The apparatus of example 2, wherein the second and third magnets have body centered cubic (BCC) lattice.

Example 7

The apparatus of example 6, wherein the second and third magnets comprises a spinel ferromagnet which includes Fe or an alloy of Fe.

Example 8

The apparatus of example 1, wherein the first magnet comprises one or a combination of materials which includes one or more of: a Heusler alloy, Co, Fe, Ni, Gd, B, Ge, Ga, permalloy, or Yttrium Iron Garnet (YIG), and wherein the Heusler alloy is a material which includes one or more of: Cu, Mn, Al, In, Sn, Ni, Sb, Ga, Co, Fe, Si, Pd, Sb, Si, V, or Ru.

Example 9

The apparatus of example 1, wherein the magnetoelectric material comprises one of: dielectric, para-electric, or ferro-electric material.

Example 10

The apparatus of example 9, wherein: the dielectric material includes one of: Hf, O, Si, Zr, Al, Sr, Ti, La, or Mo; the para-electric material includes one of: Cr, O, Hf, or Zr; and the ferroelectric material includes one of: Bi, Fe, O, Sr, Ti, La, Al, Hf, Zr, or Si.

Example 11

The apparatus of example 1, wherein the magnetoelectric material comprises a material which includes one of: Cr, O, or multiferroic material.

Example 12

The apparatus of example 11 wherein the multiferroic material comprises one or more of: Bi, Fe, O, Lu, or La.

Example 13

The apparatus of example 1, wherein the magnetoelectric material includes one or more of: La, Bi, Fe, O, Pb, Zr, Ti, Mg, Al, N, or Sm.

Example 14

The apparatus of example 1, wherein the stack of layers comprises: a first layer comprising Ag, wherein the first layer is adjacent to the third magnet; and a second layer comprising Bi or W, wherein the second layer is adjacent to the first layer and to a conductor.

Example 15

The apparatus of example 1, wherein the spin orbit material comprises one or more of: β-Ta, β-W, W, Pt, Cu doped with Iridium, Cu doped with Bismuth, Cu doped an element of 3d, 4d, 5d, 4f, or 5f of periodic table groups, Bi, Se, Te, Sn or O.

Example 16

The apparatus of example 1, wherein: a portion of the stack of the layers is coupled to ground, wherein a contact adjacent to the first magnet is coupled to a negative supply; or a portion of the stack of the layers is coupled to ground, wherein a contact adjacent to the first magnet is coupled to a positive supply.

Example 17

The apparatus of example 14, wherein the conductor comprises a material which includes one or more of: Cu, Ag, Al, Au, Co, W, Ta, Ni, or graphene.

Example 18

A system comprising: a memory; a processor coupled to the memory, the processor including: a first magnet; a second magnet adjacent to the first magnet; a first structure comprising a tunneling barrier; a third magnet adjacent to the first structure; a stack of layers, a portion of which is adjacent to the third magnet, wherein the stack of layers comprises spin-orbit material; and a second structure comprising magnetoelectric material, wherein the second structure is adjacent to the first magnet; and a wireless interface to allow the processor to communicate with another device.

Example 19

The system of example 18, wherein the tunneling barrier comprises one of: a symmetric tunneling barrier which includes one or more of: Mg, Al, or O; or a spinel tunneling barrier which includes one or more of: Mg, Al, Zn, Fe, Ni, Co, or O.

Example 20

The system of example 19, wherein: the second magnet, the third, magnet, and the symmetric tunneling barrier have face centered cubic (FCC) lattice; and the second and third magnets comprise: Co, Fe, or B; or the second and third magnets have body centered cubic lattice; and the second and third magnets comprises a spinel ferromagnet which includes Fe or an alloy of Fe.

Example 21

A method comprising: forming a first magnet; forming a second magnet adjacent to the first magnet; forming a first structure comprising forming a tunneling barrier; forming a third magnet adjacent to the first structure; forming a stack of layers, a portion of which is adjacent to the third magnet, wherein the stack of layers comprises spin-orbit material; and forming a second structure comprising magnetoelectric material, wherein the second structure is adjacent to the first magnet.

Example 22

The method of example 21, wherein forming the tunneling barrier comprises one of: forming a symmetric tunneling barrier which includes one or more of: Mg, Al, or O; or forming a spinel tunneling barrier which includes one or more of: Mg, Al, Zn, Fe, Ni, Co, or O.

Example 23

The method of example 22, wherein: the second magnet, the third, magnet, and the symmetric tunneling barrier have face centered cubic (FCC) lattice; and the second and third magnets comprise: Co, Fe, or B; or the second and third magnets have body centered cubic lattice; and the second and third magnets comprises a spinel ferromagnet which includes Fe or an alloy of Fe.

The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first magnet;
   a second magnet adjacent to the first magnet;
   a first structure comprising a tunneling barrier;
   a third magnet adjacent to the first structure;
   a stack of layers, a portion of which is adjacent to the third magnet, wherein the stack of layers comprises spin-orbit material; and
   a second structure comprising magnetoelectric material, wherein the second structure is adjacent to the first magnet.

2. The apparatus of claim 1, wherein the tunneling barrier comprises:
   a spinel tunneling barrier which includes one or more of: Mg, Al, Zn, Fe, Ni, Co, or O.

3. The apparatus of claim 2, wherein the second magnet, the third, magnet, and the symmetric tunneling barrier have face centered cubic (FCC) lattice.

4. The apparatus of claim 3, wherein the second and third magnets comprise: Co, Fe, or B.

5. The apparatus of claim 2, wherein the second magnet, the third, magnet, and the symmetric tunneling barrier have a same crystalline structure.

6. The apparatus of claim 2, wherein the second and third magnets have body centered cubic (BCC) lattice.

7. The apparatus of claim 6, wherein the second and third magnets comprises a spinel ferromagnet which includes Fe or an alloy of Fe.

8. The apparatus of claim 1, wherein the first magnet comprises one or a combination of materials which includes one or more of: a Heusler alloy, Co, Fe, Ni, Gd, B, Ge, Ga, permalloy, or Yttrium Iron Garnet (YIG), and wherein the Heusler alloy is a material which includes one or more of: Cu, Mn, Al, In, Sn, Ni, Sb, Ga, Co, Fe, Si, Pd, Sb, Si, V, or Ru.

9. The apparatus of claim 1, wherein the magnetoelectric material comprises one of: dielectric, para-electric, or ferroelectric material.

10. The apparatus of claim 9, wherein:
    the dielectric material includes one of: Hf, O, Si, Zr, Al, Sr, Ti, La, or Mo;
    the para-electric material includes one of: Cr, O, Hf, or Zr; and
    the ferroelectric material includes one of: Bi, Fe, O, Sr, Ti, La, Al, Hf, Zr, or Si.

11. The apparatus of claim 1, wherein the magnetoelectric material comprises a material which includes one of: Cr, O, or multiferroic material.

12. The apparatus of claim 11 wherein the multiferroic material comprises one or more of: Bi, Fe, O, Lu, or La.

13. The apparatus of claim 1, wherein the magnetoelectric material includes one or more of: La, Bi, Fe, O, Pb, Zr, Ti, Mg, Al, N, or Sm.

14. The apparatus of claim 1, wherein the stack of layers comprises:
    a first layer comprising Ag, wherein the first layer is adjacent to the third magnet; and
    a second layer comprising Bi or W, wherein the second layer is adjacent to the first layer and to a conductor.

15. The apparatus of claim 1, wherein the spin orbit material comprises one or more of: β-Ta, β-W, W, Pt, Cu doped with Iridium, Cu doped with Bismuth, Cu doped an element of 3d, 4d, 5d, 4f, or 5f of periodic table groups, Bi, Se, Te, Sn or O.

16. The apparatus of claim 1, wherein:
    a portion of the stack of the layers is coupled to ground, wherein a contact adjacent to the first magnet is coupled to a negative supply; or
    a portion of the stack of the layers is coupled to ground, wherein a contact adjacent to the first magnet is coupled to a positive supply.

17. The apparatus of claim 14, wherein the conductor comprises a material which includes one or more of: Cu, Ag, Al, Au, Co, W, Ta, Ni, or graphene.

18. A system comprising:
    a memory;
    a processor coupled to the memory, the processor including:
    a first magnet;
    a second magnet adjacent to the first magnet;
    a first structure comprising a tunneling barrier;
    a third magnet adjacent to the first structure;
    a stack of layers, a portion of which is adjacent to the third magnet, wherein the stack of layers comprises spin-orbit material; and a second structure comprising magnetoelectric material, wherein the second structure is adjacent to the first magnet; and a wireless interface to allow the processor to communicate with another device.

19. The system of claim 18, wherein the tunneling barrier comprises one of:

a spinel tunneling barrier which includes one or more of: Mg, Al, Zn, Fe, Ni, Co, or O.

20. The system of claim 19, wherein:

the second magnet, the third, magnet, and the symmetric tunneling barrier have face centered cubic (FCC) lattice; and the second and third magnets comprise: Co, Fe, or B; or the second and third magnets have body centered cubic lattice; and the second and third magnets comprises a spinel ferromagnet which includes Fe or an alloy of Fe.

* * * * *